United States Patent
Furuya

(10) Patent No.: US 9,825,426 B2
(45) Date of Patent: Nov. 21, 2017

(54) OPTICAL MODULE, OPTICAL APPARATUS, METHOD FOR FABRICATING OPTICAL MODULE

(71) Applicant: SUMITOMO ELECTRIC INDUSTRIES, LTD., Osaka (JP)

(72) Inventor: Akira Furuya, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/217,791

(22) Filed: Jul. 22, 2016

(65) Prior Publication Data
US 2017/0033529 A1    Feb. 2, 2017

(30) Foreign Application Priority Data
Jul. 27, 2015 (JP) ................. 2015-147947

(51) Int. Cl.
*H01S 5/022* (2006.01)
*H01S 5/042* (2006.01)

(52) U.S. Cl.
CPC ........ *H01S 5/02252* (2013.01); *H01S 5/0425* (2013.01)

(58) Field of Classification Search
CPC ............................. H01S 5/02252; H01S 5/0425
See application file for complete search history.

(56) References Cited

U.S. PATENT DOCUMENTS 5,787,215 A * 7/1998 Kuhara ................... H01L 31/12
257/E31.095
5,949,654 A * 9/1999 Fukuoka ................. H01L 21/50
257/700

OTHER PUBLICATIONS

Peter De Dobbelaere, "Silicon Photonics technology Platform for High Speed Interconnect", http://www.semiconwest.org/sites/semiconwest.org/files/docs, Luxtera.pdf, Jul. 11, 2013.

* cited by examiner

*Primary Examiner* — Dung Nguyen
(74) *Attorney, Agent, or Firm* — Smith, Gambrell & Russell, LLP

(57) ABSTRACT

An optical module includes a bench part and a cap on the bench part. The bench part includes a bench, an electrode, a semiconductor optical device and a lens. The electrode is disposed on the first and second areas of the bench. The semiconductor optical device is disposed on the electrode in the first area. The cap includes a base, a pad electrode, a conductor, a ceiling, a front wall, and a rear wall. The pad electrode is disposed on the base. The conductor is disposed on the base and connected to the pad electrode. The electrode is electrically connected to the conductor on the second area. The ceiling extends along a first plane. The front wall has a front outer face extending along a second plane intersecting the first plane. The rear wall extends from the ceiling in a direction from the cap to the bench.

7 Claims, 20 Drawing Sheets

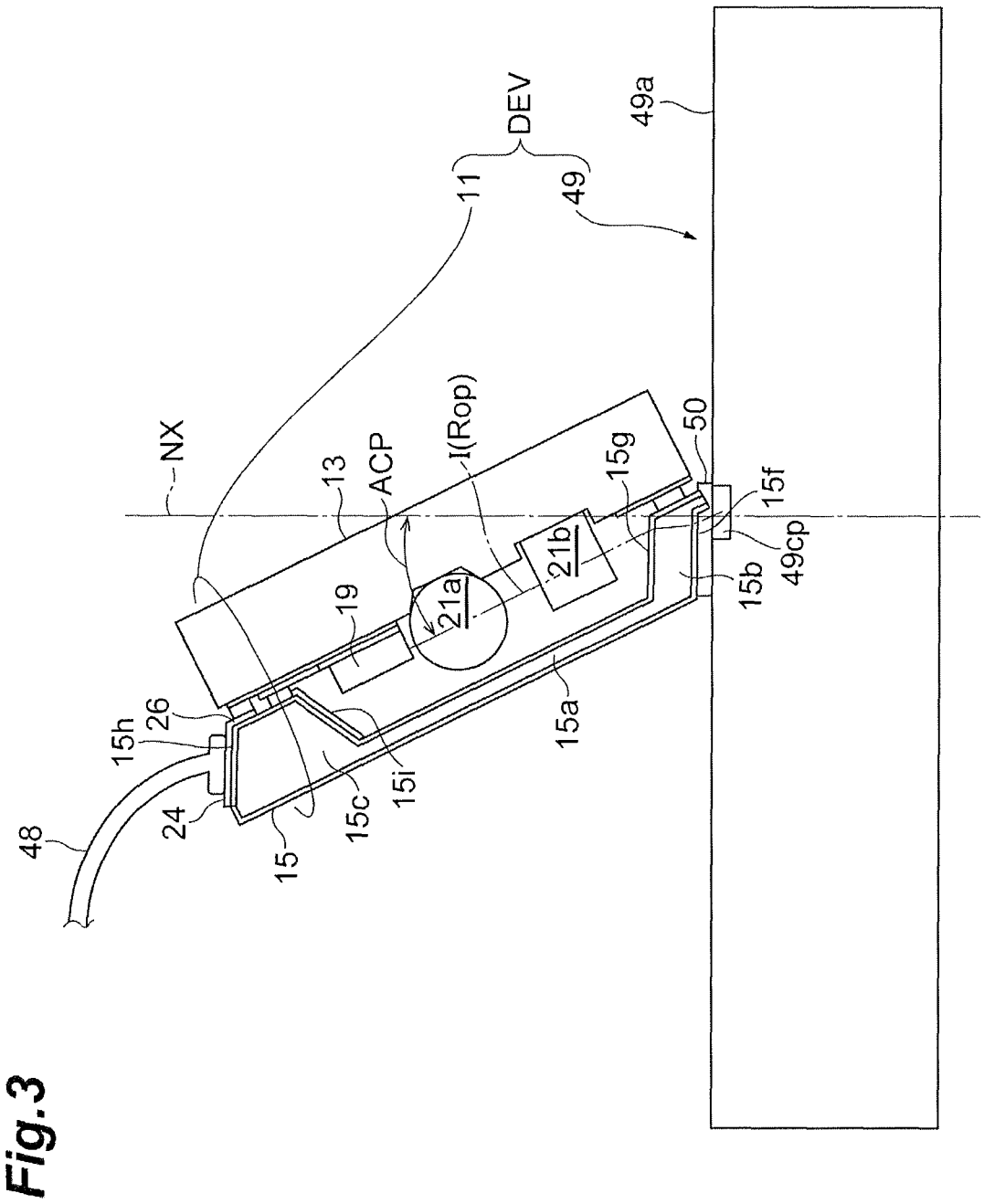

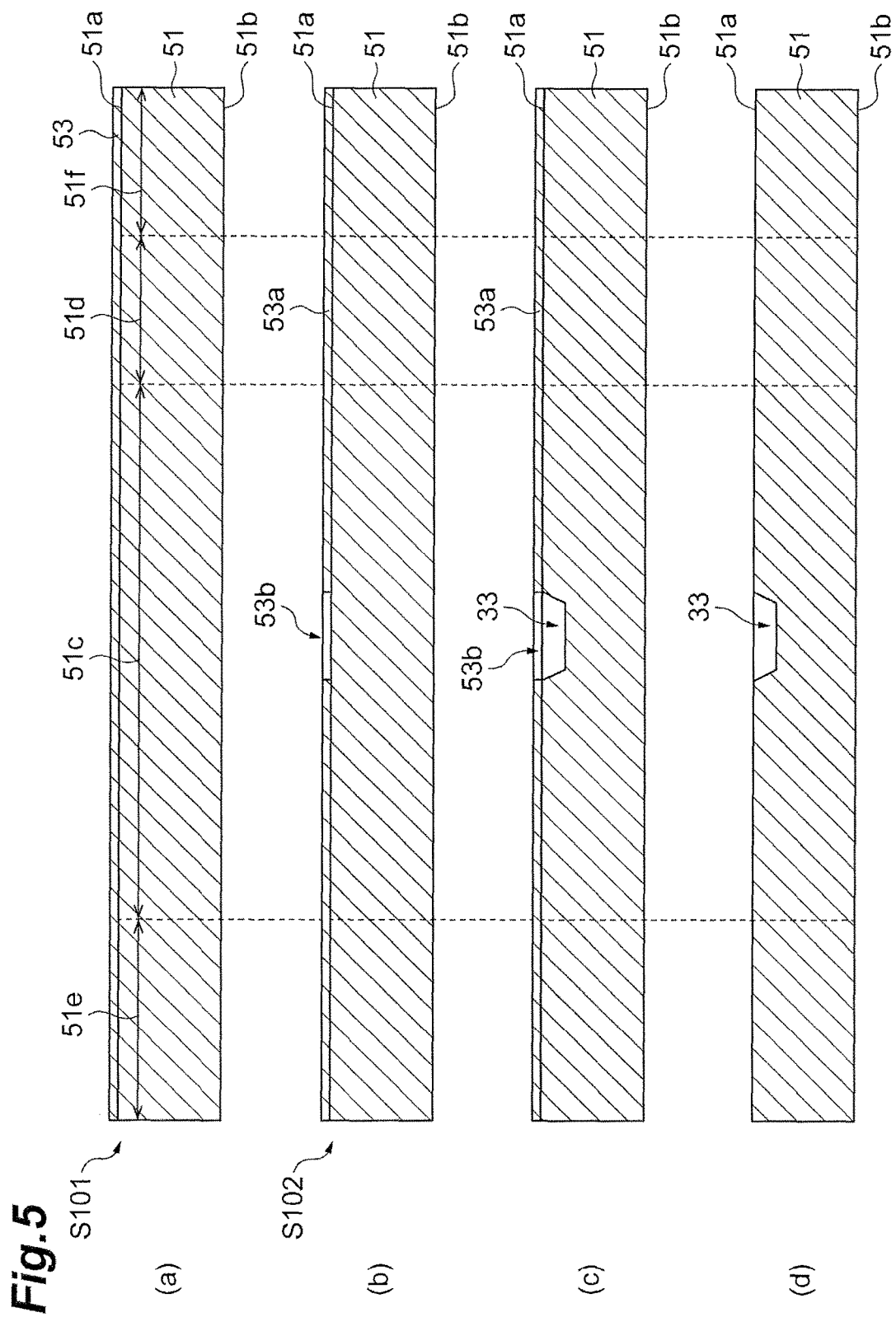

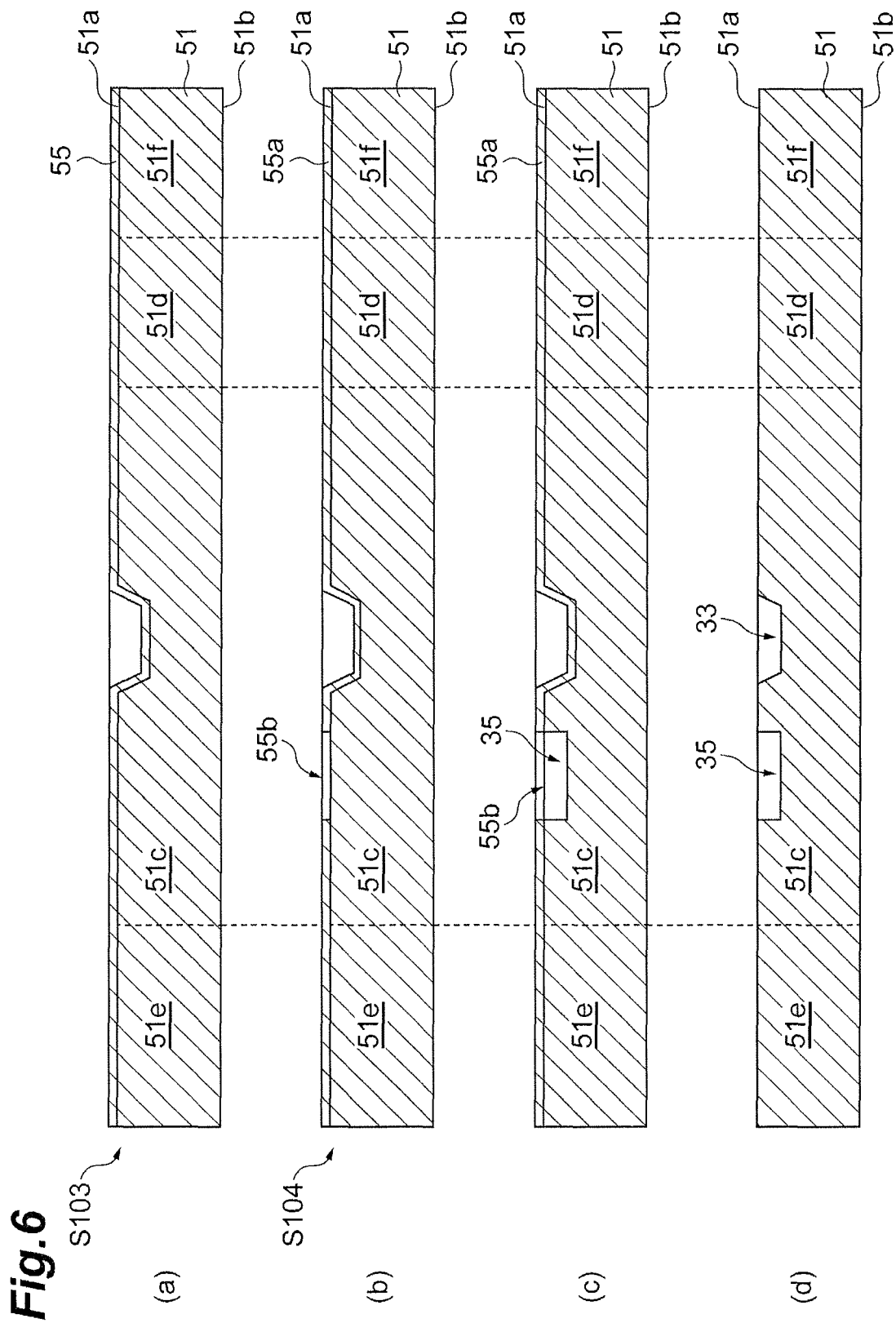

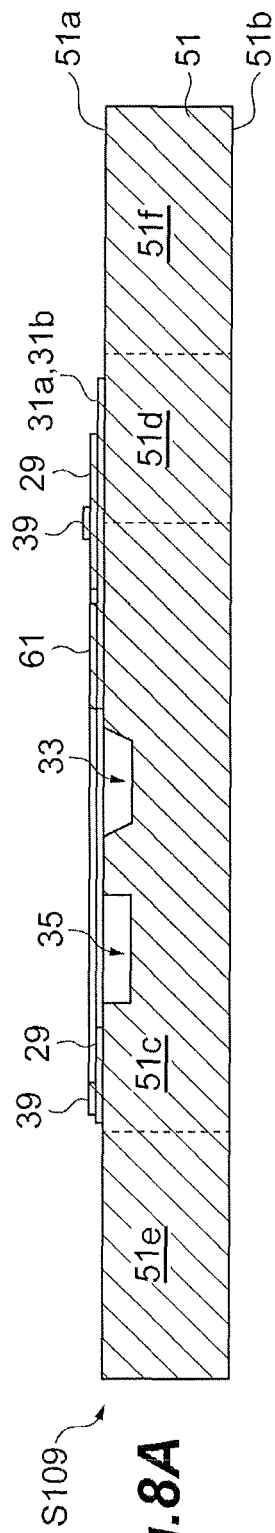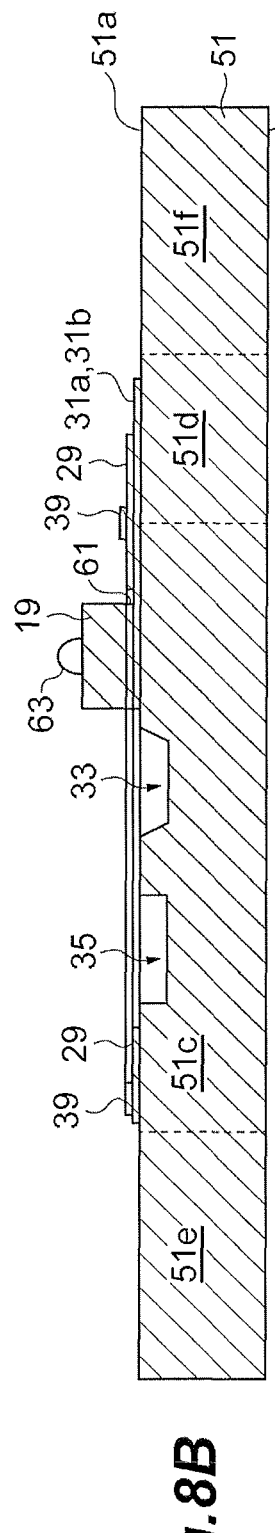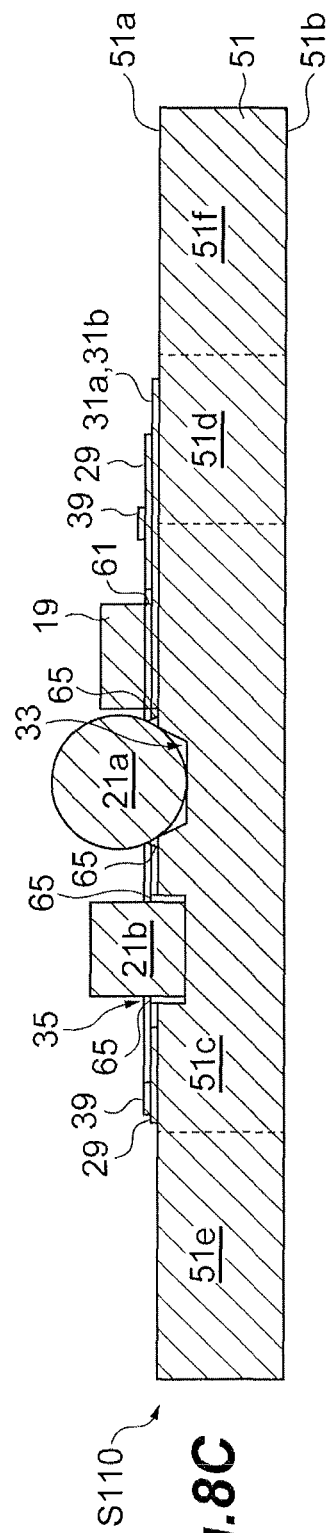

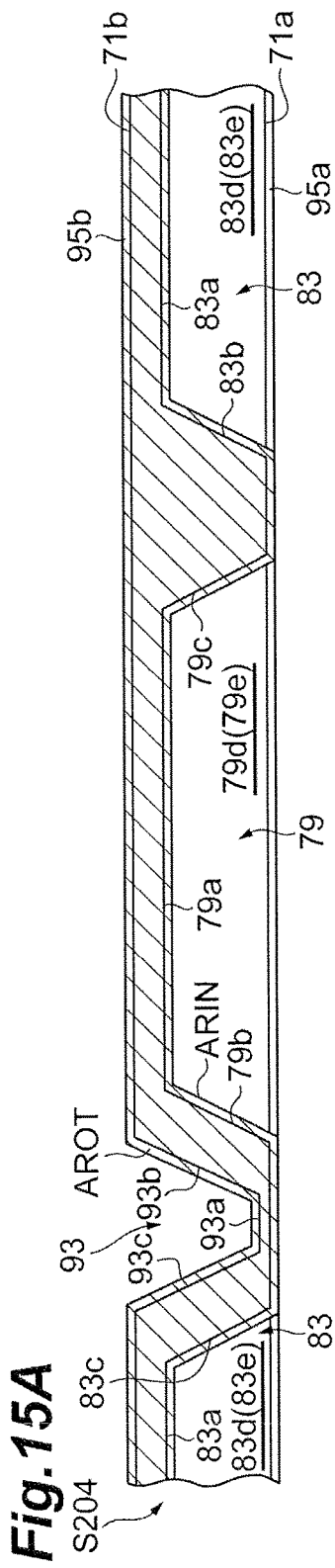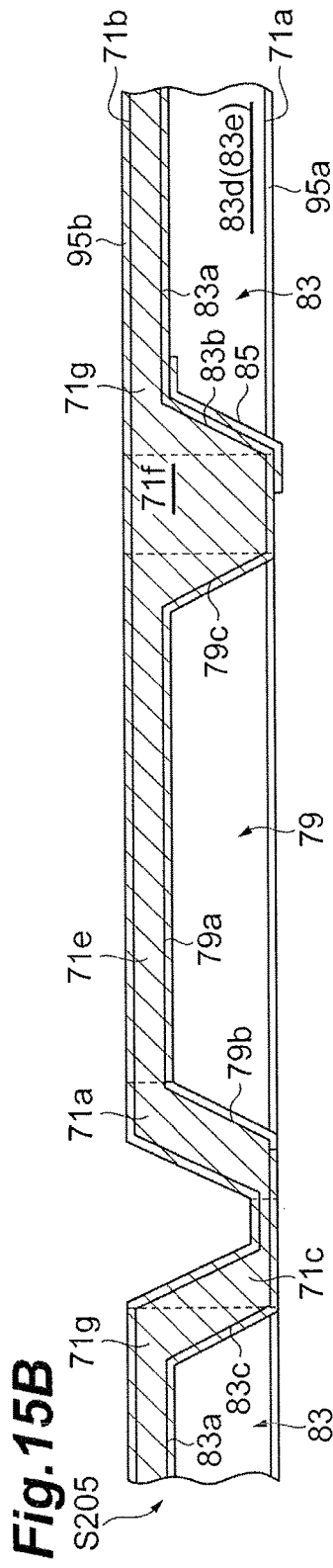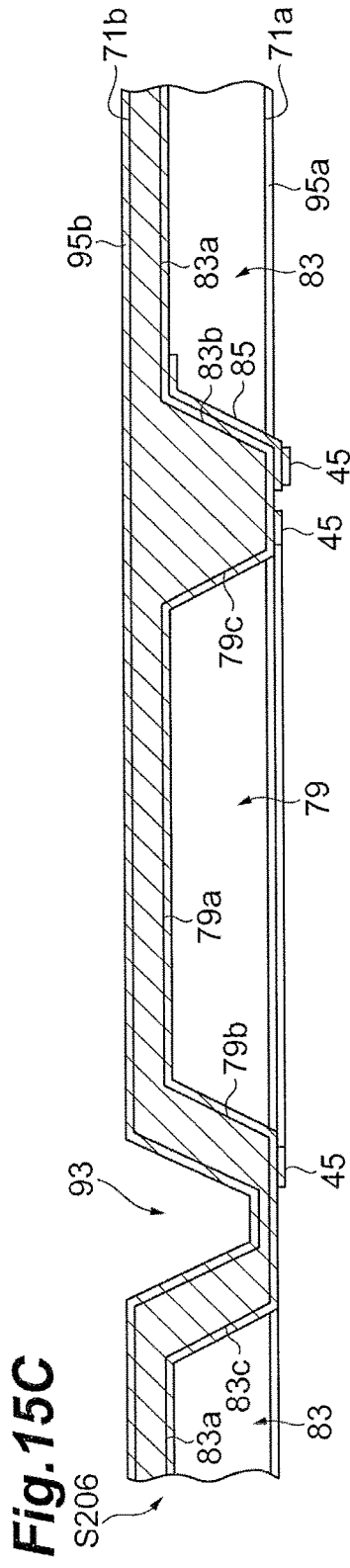

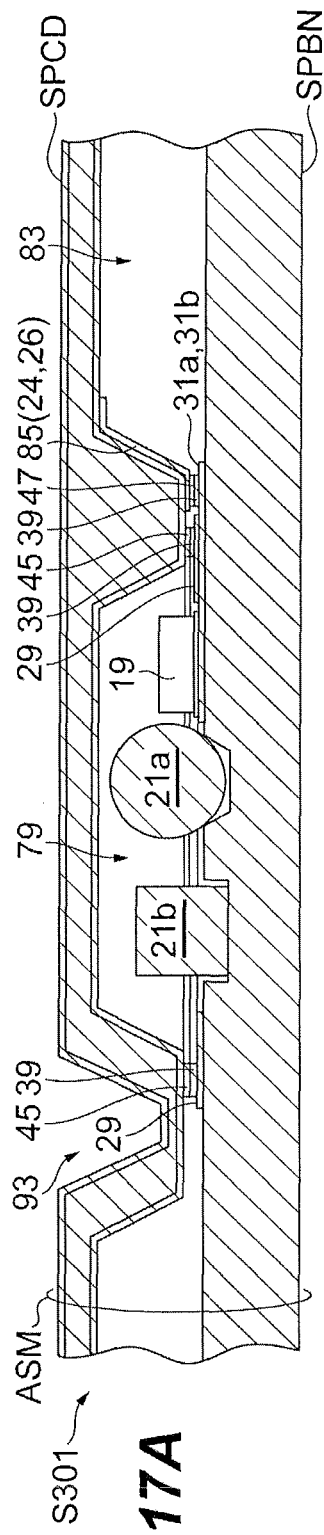
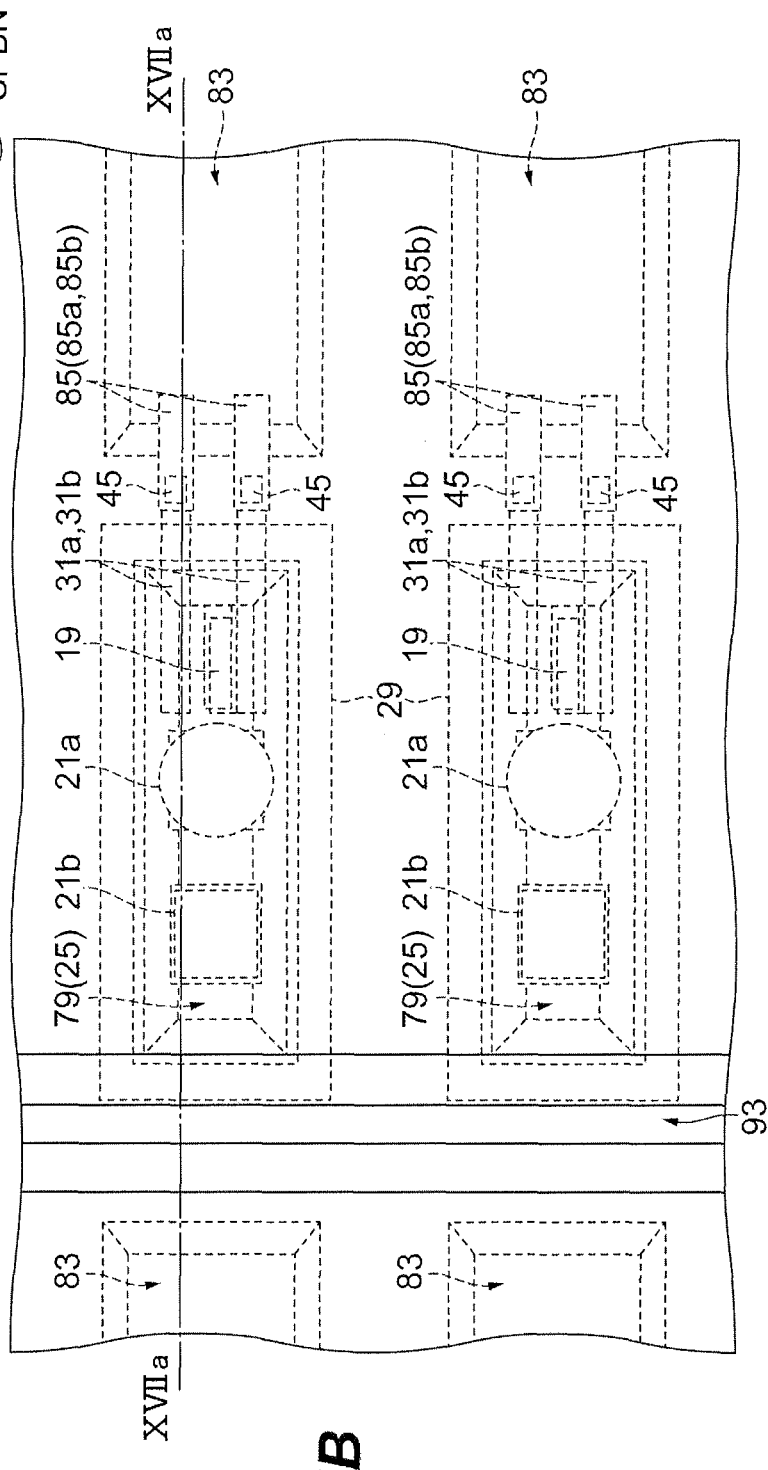
Fig. 17A
Fig. 17B

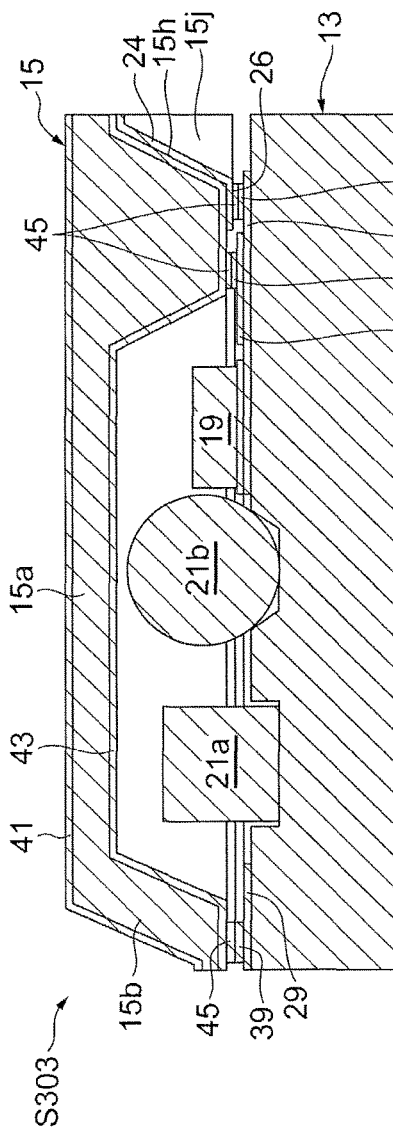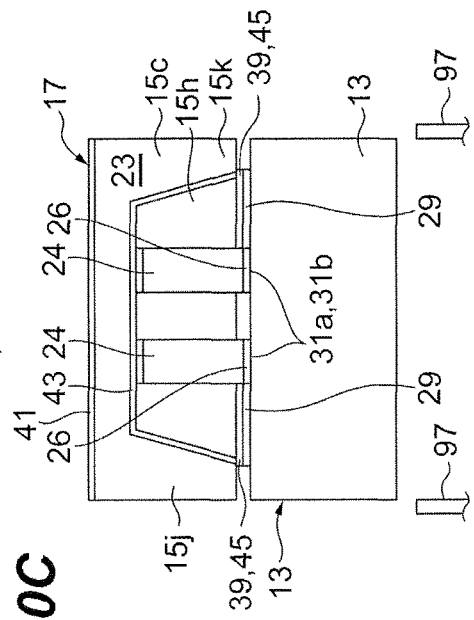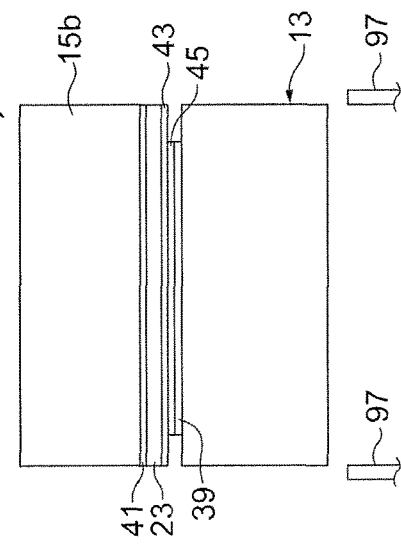

OPTICAL MODULE, OPTICAL APPARATUS, METHOD FOR FABRICATING OPTICAL MODULE

BACKGROUND OF THE INVENTION

Field of the Invention

The present invention relates to an optical module, an optical apparatus, and a method for fabricating an optical module. This application claims the benefit of priority from Japanese Patent Application No. 2015-147947 filed on Jul. 27, 2015, which is herein incorporated by reference in its entirety.

Related Background Art

A compact laser module is disclosed by the following URL. http://www.semiconwest.org/sites/semiconwest.org/files/docs/SW2013_P.%20De%20Dobbelaere_Luxtera.pdf

SUMMARY OF THE INVENTION

One aspect of the present invention relates to an optical module. The optical module includes: a bench part including a bench, an electrode, a semiconductor optical device, and a lens, the bench having a principal surface with a first area and a second area, the electrode being disposed on the first area and the second area, the semiconductor optical device being disposed on the electrode in the first area, and the lens being supported by the first area; and a cap disposed on the bench part, the cap including a base, a pad electrode and a conductor, the cap including a cavity, a ceiling, a front wall, a first side wall, a second side wall, a rear wall, the cavity containing the semiconductor optical device and the lens, the pad electrode being disposed on the base, and the conductor being disposed on the base and connected to the pad electrode, the second area of the bench surrounding the first area, the electrode on the second area being electrically connected to the conductor, the semiconductor optical device, the lens and the front wall and the rear wall of the cap being arranged on a principal surface of the bench part along an optical reference plane extending in a direction of a first axis, and the ceiling extending along a first plane, the front wall having a front outer face extending along a second plane, the second plane intersecting with the first plane, and the rear wall extending from the ceiling in a direction from the cap to the bench.

Another aspect of the present invention relates to an optical apparatus. The optical apparatus includes: the optical module; and an optical part supporting the front wall of the optical module, the optical part being optically coupled to the semiconductor optical device through the front wall of the optical module, and the front wall of the cap being made of a material allowing light of the semiconductor optical device to pass through the front wall.

Yet another aspect of the present invention relates to a method for fabricating an optical module. The method includes: preparing a single crystal semiconductor substrate having a first surface and a second surface, the single crystal semiconductor substrate including a first region, a second region, a third region, a fourth region and a fifth region arranged in order along a first reference plane in each of arrayed sections; forming a first mask on the first surface of the single crystal semiconductor substrate, the first mask having a first opening pattern and a second opening pattern; forming a first outer opening and an inner opening in the first surface of the single crystal semiconductor substrate by etching with the first mask, the first outer opening being provided for a rear wall, the inner opening being provided for a cavity, and the first outer opening and the inner opening corresponding to the first opening pattern and the second opening pattern, respectively; after forming the first outer opening and the inner opening, forming a metal layer on the fourth region and the fifth region of the single crystal semiconductor substrate, the metal layer being provided for a pad electrode and a conductor; forming a second mask with a third pattern on the second surface of the single crystal semiconductor substrate; forming a second outer opening in the second surface of the single crystal semiconductor substrate by etching with the second mask, the second outer opening corresponding to the third pattern of the second mask, the second outer opening being provided for a front wall; preparing a bench product including a support having a principal surface with a first area and a second area in each of arrayed sections, an electrode disposed on the first area and the second area of the support, a semiconductor optical device disposed on the electrode on the first area of the support, and a lens disposed on the first area of the support; and after forming the first outer opening, the inner opening and the second outer opening, assembling the single crystal semiconductor substrate and the bench product to make an assembly including the cavity provided by the inner opening, the cavity receiving the semiconductor optical device and the lens of the bench product therein, the second area of the support of the bench product supporting the single crystal semiconductor substrate, the first surface of the single crystal semiconductor substrate being opposite to the second surface, the second outer opening having a bottom face in the first region of the single crystal semiconductor substrate, the inner opening having a bottom face and a side face in the third region of the single crystal semiconductor substrate, the second outer opening having a side face in the second region of the single crystal semiconductor substrate, the inner opening has another side face in the second region of the single crystal semiconductor substrate, the fourth region being disposed between the inner opening and the first outer opening, and the first outer opening having a side face in the fifth region of the single crystal semiconductor substrate, the side face of the inner opening extending along a first reference plane intersecting with the first reference plane, the side face of the first outer opening extending along a first outer reference plane intersecting with the first reference plane, and the side face of the second outer opening extending along a second outer reference plane intersecting with the first reference plane.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 3 is a schematic view showing an optical device, mounting the optical module, according to an embodiment of the present embodiment.

FIG. 5 shows cross sections, taken along a line corresponding to the cross-section shown in FIG. 2, illustrating respective major steps in a method of making a bench product for a bench part according to the present embodiment.

FIG. 6 shows major steps in the method of making a bench product according to the present embodiment.

FIGS. 8A, 8B and 8C are views showing major steps in the method of making a bench product according to the present embodiment.

FIGS. 15A, 15B and 15C are cross sectional views showing major steps in the method of making a cap product according to the present embodiment.

FIGS. 17A and 17B are schematic views each showing the process of joining the bench product and the cap product with each other.

FIGS. 20A, 20B and 20C each show the appearance of the optical module produced by the method.

DESCRIPTION OF EMBODIMENTS

Figure 1:
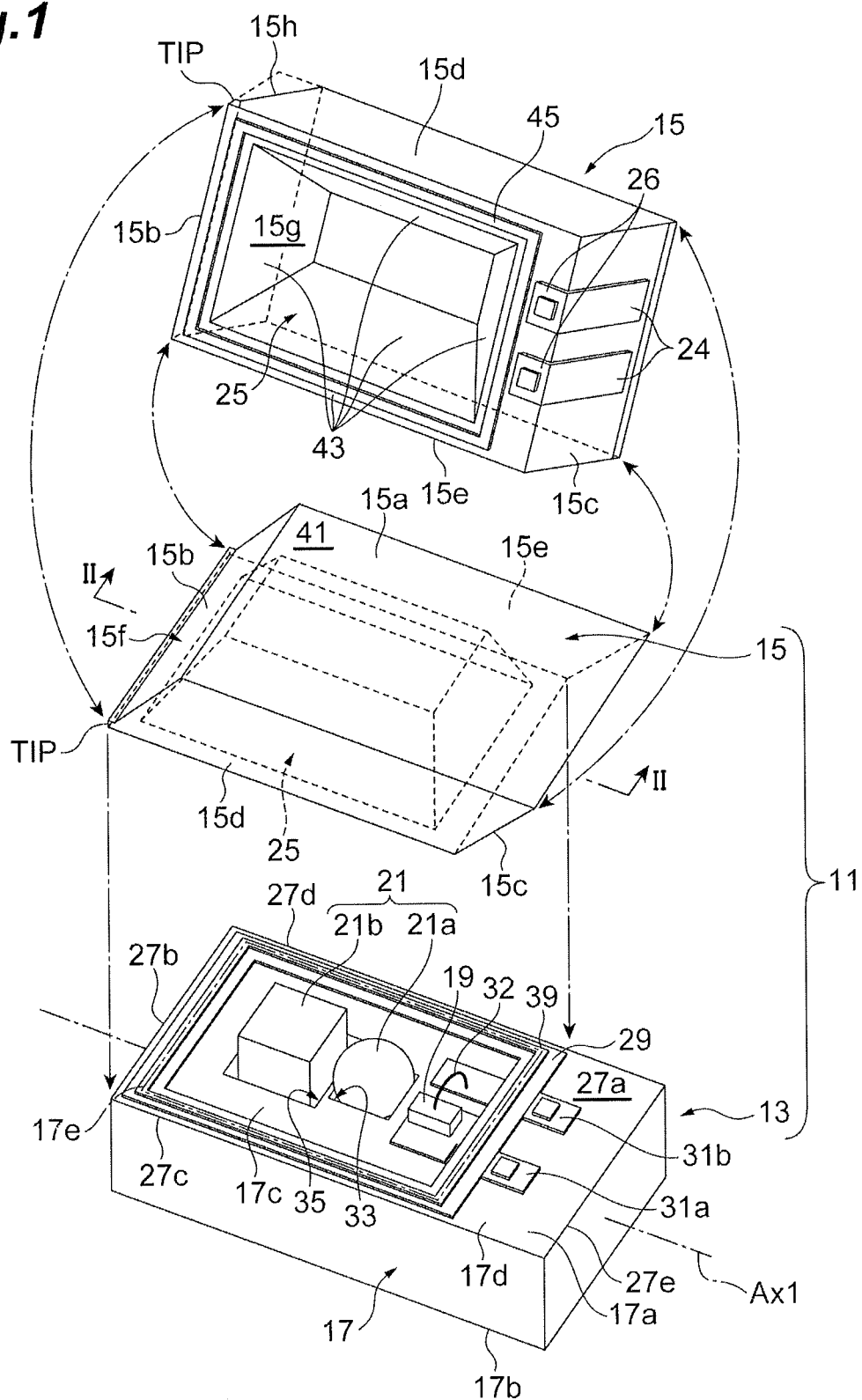
FIG. 1 is a schematic view showing an optical module according to the present embodiment.

The compact laser module comprises a substrate, an optical component provided on the substrate (an edge-emitting semiconductor laser, a lens, and an isolator), and a reflecting mirror for reflecting light from the semiconductor laser to the substrate. The laser module is optically coupled to a device, which receives the light emitted from the back surface of the substrate. Electrical connection between the laser module and an external device is made via an electrode, disposed on the substrate, which is connected to the semiconductor laser.

Studies conducted by the inventor have found that an electrical connection to the semiconductor laser on the substrate via an electrode on the substrate may restrict the application of the optical module. Alleviating restrictions on such an electrical connection may expand the application scope of the above optical module.

It is an object of one aspect of the present invention to provide an optical module having a structure that can alleviate restrictions on the orientation of the optical module in its optical coupling in the mounting of the optical module. It is an object of another aspect of the present invention to provide an optical apparatus including the optical module. It is yet another aspect of the present invention to provide a method of fabricating the optical module.

A number of specific embodiments according to the above aspects are described below.

One embodiment according to the above aspect relates to an optical module. The optical module includes: a bench part including a bench, an electrode, a semiconductor optical device, and a lens, the bench having a principal surface with a first area and a second area, the electrode being disposed on the first area and the second area, the semiconductor optical device being disposed on the electrode in the first area, and the lens being supported by the first area; and a cap disposed on the bench part. The cap includes a base, a pad electrode and a conductor. The cap includes a cavity, a ceiling, a front wall, a first side wall, a second side wall, a rear wall. The cavity contains the semiconductor optical device and the lens. The pad electrode is disposed on the base, and the conductor is disposed on the base and connected to the pad electrode. The second area of the bench surrounds the first area. The electrode on the second area is electrically connected to the conductor. The semiconductor optical device, the lens and the front wall and the rear wall of the cap are arranged on a principal surface of the bench part along an optical reference plane extending in a direction of a first axis. The ceiling extends along a first plane. The front wall has a front outer face extending along a second plane intersecting with the first plane, and the rear wall extends from the ceiling in a direction from the cap to the bench.

In the bench part of this optical module, the electrode is provided on the first area and the second area, the semiconductor optical device is provided on the electrode in the first area, and the lens is supported by the first area. The bench part forces the electrode of the bench part to extend on the principal surface of the bench (the first and second areas), so that the orientation of the principal surface of the bench and the orientation of the electrode on the principal surface are restricted depending upon the optical coupling direction of the optical module in mounting the optical module. The electrode of the bench part is electrically connected to the conductor on the base of the cap in the second area of the bench. The optical module can be electrically connected to an external device via the pad electrode connected to the conductor on the cap, instead of being electrically connected to an external device via an electrode located on the bench part. The optical module the cap of which is provided with the pad electrode can reduce constraints on the direction of the optical coupling of the optical module in the mounting of the optical module.

In the optical module according to the present embodiment, the first side wall and the second side wall of the cap extend in the direction of the first axis; the front wall, the first side wall, the second side wall, and the rear wall are disposed on the second area of the bench part; and the semiconductor optical device and the lens are hermetically sealed by the cap and the bench of the second area.

In this optical module, the front wall, the first side wall, the second side wall and the rear wall of the cap are supported by the second area of the bench part, so that the assembly of the bench part and the cap can seal the semiconductor optical device and the lens.

In the optical module according to the present embodiment, the bench includes a silicon base and the silicon base of the bench has a principal surface with a recess for positioning the lens.

In this optical module, the electrode and the positioning recesses can be formed by processing, thereby forming the silicon base having them.

In the optical module according to the present embodiment, the bench part includes an insulating layer disposed on the electrode in the second area; the electrode includes a first portion, a second portion and a third portion; the first portion of the electrode extends on the first area to be connected to the second portion; the insulating layer extends across the second portion of the electrode; and the third portion of the electrode connects the second portion to the conductor.

This optical module allows the sealing and the connection between the conductor and the electrode.

In the optical module according to the present embodiment, the cap includes an insulating layer disposed on the second area of the bench part; the conductor includes a first portion, a second portion and a third portion; the first portion of the electrode connects the pad electrode to the second portion the electrode; the insulating layer extends across the second portion; and the third portion of the electrode connects the second portion to the electrode.

This optical module allows the sealing and the connection between the conductor and the electrode.

One embodiment according to the above aspect relates to an optical apparatus. The optical apparatus includes; the optical module; an optical part supporting the front wall of the optical module. The optical part is optically coupled to the semiconductor optical device through the front wall of the optical module, and the front wall of the cap is made of a material allowing light of the semiconductor optical device to pass through the front wall.

The optical apparatus can optically couple the optical module to an optical part through the front wall of the optical module, and the pad electrode disposed on the cap of the optical module can be used to make the electrical connection of the optical module.

In the optical apparatus according the present embodiment, the optical part includes a semiconductor integrated device having an optical grating coupler, and the optical grating coupler being optically coupled to the semiconductor optical device.

The optical apparatus can couple the optical integrated device to the optical module, and the optical module make electrical connection via the pad electrode disposed on the rear face of the rear wall.

One embodiment according to the above aspect relates to a method for fabricating an optical module. The method includes the steps of: preparing a single crystal semiconductor substrate having a first surface and a second surface, the single crystal semiconductor substrate including a first region, a second region, a third region, a fourth region and a fifth region arranged in order along a first reference plane in each of arrayed sections; forming a first mask on the first surface of the single crystal semiconductor substrate, the first mask having a first opening pattern and a second opening pattern; forming a first outer opening and an inner opening in the first surface of the single crystal semiconductor substrate by etching with the first mask, the first outer opening being provided for a rear wall, the inner opening being provided for a cavity, and the first outer opening and the inner opening corresponding to the first opening pattern and the second opening pattern, respectively; after forming the first outer opening and the inner opening, forming a metal layer on the fourth region and the fifth region of the single crystal semiconductor substrate, the metal layer being provided for a pad electrode and a conductor; forming a second mask with a third pattern on the second surface of the single crystal semiconductor substrate; forming a second outer opening in the second surface of the single crystal semiconductor substrate by etching with the second mask, the second outer opening corresponding to the third pattern of the second mask, the second outer opening being provided for a front wall; preparing a bench product including a support having a principal surface with a first area and a second area in each of arrayed sections, an electrode disposed on the first area and the second area of the support, a semiconductor optical device disposed on the electrode on the first area of the support, and a lens disposed on the first area of the support; after forming the first outer opening, the inner opening and the second outer opening, assembling the single crystal semiconductor substrate and the bench product to make an assembly including the cavity provided by the inner opening, the cavity receiving the semiconductor optical device and the lens of the bench product therein, the second area of the support of the bench product supporting the single crystal semiconductor substrate. The first surface of the single crystal semiconductor substrate is opposite to the second surface. The second outer opening has a bottom face in the first region of the single crystal semiconductor substrate. The inner opening has a bottom face and a side face in the third region of the single crystal semiconductor substrate. The second outer opening has a side face in the second region of the single crystal semiconductor substrate. The inner opening has another side face in the second region of the single crystal semiconductor substrate. The fourth region is disposed between the inner opening and the first outer opening, and the first outer opening has a side face in the fifth region of the single crystal semiconductor substrate. The side face of the inner opening extends along a first reference plane intersecting with the first reference plane. The side face of the first outer opening extends along a first outer reference plane intersecting with the first reference plane, and the side face of the second outer opening extends along a second outer reference plane intersecting with the first reference plane.

In the method of producing an optical module, the inner opening for the cavity, which has a bottom face located in the third region of the single crystal semiconductor substrate, and the first outer opening for the rear wall, which has the side face located in the fifth region of the single crystal semiconductor substrate, are formed by etching the first surface, and the second outer opening for the front wall, which has a bottom face in the first region of the single crystal semiconductor substrate, is formed by etching the second surface. Each of the first mask of the first opening pattern and the second mask of the third opening pattern is formed by patterning such that the side face of the inner opening and the side face of the first outer opening are positioned in the second region of the single crystal semiconductor substrate. The inner opening for the cavity and the front wall and rear wall of the cap, and the first and second outer openings can be formed by the individual etching processes. The side face of the inner opening, the side face of the first outer opening and the side face of the second outer opening extend along the first inner reference plane, the first outer reference plane and the second outer reference plane, respectively, and the first inner reference plane, and the second outer reference plane are inclined at an acute angle with respect to the first reference plane. The metal layer for the pad electrode and the conductor is formed in the fourth region and the fifth region of the single crystal semiconductor substrate, so that the resultant optical module has the metal layer on the outer face of the rear wall. The method can fabricate the optical module that can be electrically connected with an external device through the metal layer extending on the single crystal semiconductor substrate (the metal layer for the cap conductor and the pad electrode) rather than through an electrode on the bench product (the electrode on the bench part). The optical module can reduce constraints on the direction of the optical coupling of the optical module in mounting the optical module.

The method according to the present embodiment further includes the steps of: cutting the assembly in the first region of the single crystal semiconductor substrate to form an optical module part; and cutting the assembly in the fifth region of the single crystal semiconductor substrate to form an optical module.

In the method of producing the optical module, the optical module can be produced from the assembly by cutting it.

Teachings of the present invention can be readily understood by considering the following detailed description with reference to the accompanying drawings shown as examples. Referring to the accompanying drawings, embodiments of an optical module, the optical apparatus and a method of producing an optical module according to the present invention will be described. To facilitate understanding, identical reference numerals have been used, where possible, to designate identical elements that are common to the figures.

Figure 2:
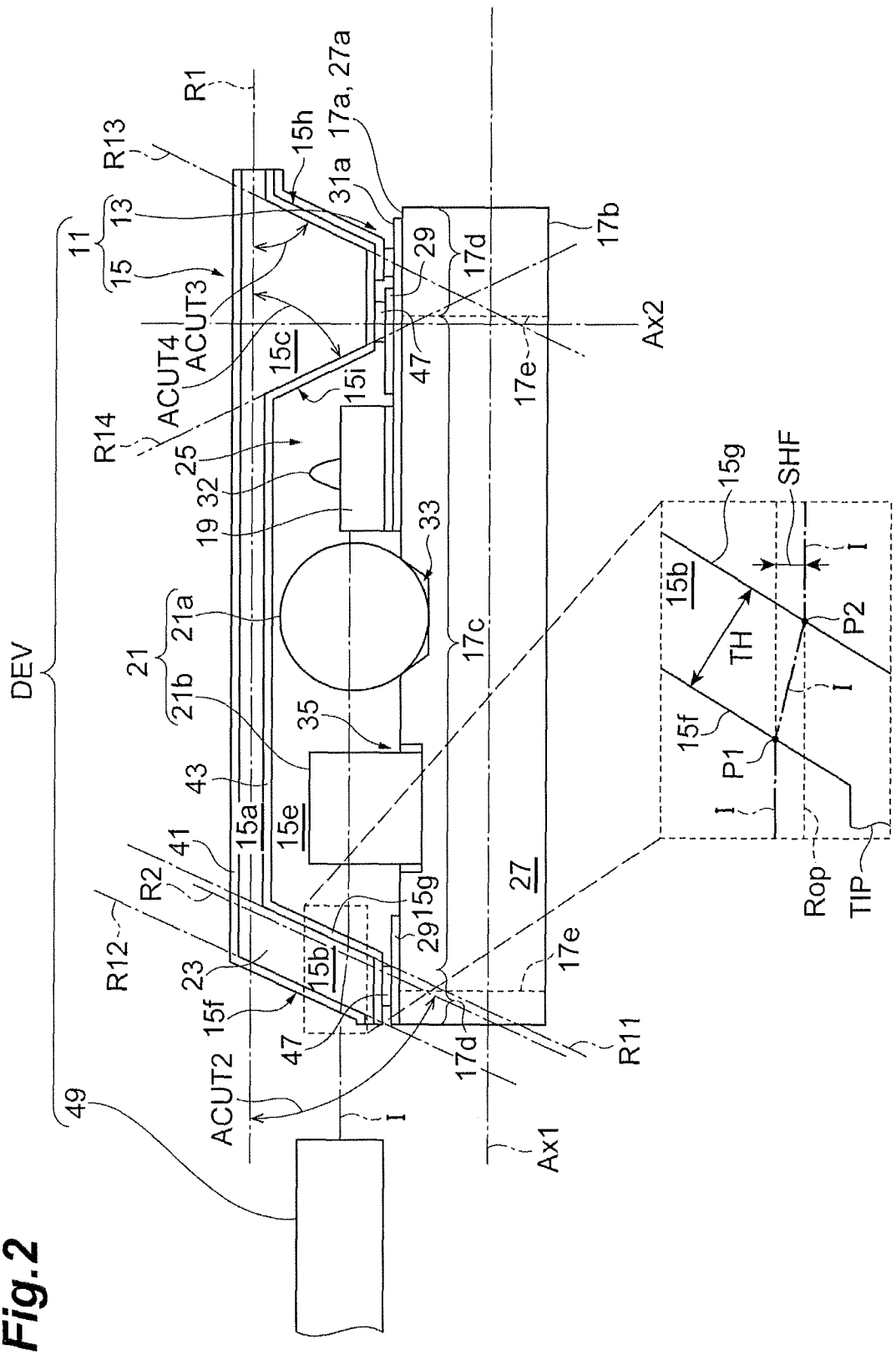
FIG. 2 schematically shows a longitudinal cross section taken along a II-II line shown in FIG. 1.

FIG. 1 is a schematic view showing an optical module according to the present embodiment. FIG. 2 is a longitudinal cross sectional view, taken along a line II-II shown in FIG. 1, schematically showing the optical module. An optical module 11 includes a bench part 13 and a cap 15. The cap 15 is disposed on the bench part 13, and has a cap base 23 made of silicon. The bench part 13 has a bench 17 and a semiconductor optical device 19, and if necessary, may further include an optical component 21. The optical component 21 may include a lens 21a, and may further include an optical isolator 21b. The semiconductor optical device 19 can be, for example, a laser diode or a photodiode. The semiconductor optical device 19 can process light of, for example, 1.3 µm band, 1.55 µm band, or 1.49 µm band. The bench 17 has a principal surface 17a and a back surface 17b, and the back surface 17b is opposite to the principal surface 17a. The principal surface 17a includes a first area 17c and a second area 17d. The semiconductor optical device 19 and the optical component 21 are disposed on the first area 17c. The second area 17d encircles the first area 17c. The optical component 21, such as lens 21a, is supported by the first area 17c. Referring to FIG. 2, the optical module 11 is optically coupled to the optical part 49, which acts as an external device, such that the optical module 11 and the optical part 49 constitute the optical apparatus DEV.

The cap 15 includes a ceiling 15a, a front wall 15 b, and a rear wall 15c. The cap 15 has a cavity 25 for accommodating the semiconductor optical device 19 and the optical component 21. In the present embodiment, the semiconductor optical device 19, the optical component 21, and the front wall 15b and the rear wall 15c of the cap 15 are arranged on the principal surface 17a of the bench 17 along an optical reference plane Rop extending in the direction of the first axis Ax1. The semiconductor optical device 19 is optically coupled to the front wall 15b of the cap 15 through the optical component 21, such as, a lens 21a. The light beam I associated with the semiconductor optical device 19 (the light beam that the semiconductor optical device 19 emits or receives) can pass through the front wall 15b of the cap 15. More specifically, as shown in FIG. 2, the ceiling 15a extends along the first reference plane R1. The front wall 15b extends along the second reference plane R2 from the ceiling 15a. The second reference surface R2 is inclined with respect to the first reference plane R1 at an angle ACUT2. The front inner face 15g of the front wall 15b has a portion extending along a first inner reference plane R11, which is inclined with respect to the first reference plane R1, and the front outer face 15f of the front wall 15b has a portion extending along a first outer reference plane R12, which is inclined with respect to the first reference plane R1 and the optical reference plane Rop. In a preferred embodiment, the inclination angle of the first inner reference plane R11 can be an angle ACUT2, and the inclination angle of the first outer reference plane R12 can be an angle ACUT2. The angle ACUT2 is preferably less than 90 degrees and greater than zero. Specifically, the outer and inner faces of the cap base 23 that correspond to the front outer face 15f and the front inner face 15g of the front wall 15b, respectively, are provided with a (111) plane of the base made of silicon. In this module, the angle ACUT2 can be, for example 54.7 degrees, which is defined as an angle between the silicon (111) plane and the silicon (001) plane. In the present embodiment, the optical reference plane Rop intersects with an axis normal to the principal surface 17a of the bench 17. The optical reference plane Rop to which the normal of the principal surface 17a of the bench 17 is perpendicular forms respective acute angles with the second reference plane R2, the first inner reference plane R11 and the first outer reference plane R12.

The rear wall 15c extends from the ceiling 15a in a direction from the cap 15 to the bench part 13 (the direction of the second axis Ax2 intersecting the first axis Ax 1). An outer face 15h of the rear wall 15c has a portion extending along a second outer reference plane R13, which is inclined with respect to the first reference plane R1 and the optical reference plane Rop, and an inner face 15i of the rear wall 15c has a portion extending along a second inner reference plane R14, which is inclined with the first reference plane R1 and the optical reference plane Rop. The second outer reference plane R13 is inclined at an angle ACUT3 with the first reference surface R1. The angle ACUT3 is preferably less than 90 degrees and larger than zero degrees. The second inner reference plane R14 is inclined at an angle ACUT4 with the first reference surface R1. The angle ACUT4 is preferably larger than 90 degrees and larger than zero degrees. Specifically, the outer and inner faces of the cap base 23 that correspond to the outer and inner faces 15h and 15i of the rear wall 15c, respectively, are provided with a (111) plane of the base made of silicon.

The front wall 15b of the cap 15, the semiconductor optical device 19 and the optical component 21, are arranged on the principal surface 17a along the optical reference plane Rop (as a specific example, a plane which is perpendicular to the normal of the principal surface 17a of the bench 17). In the present embodiment, the front wall 15b of the cap 15 is inclined with the optical reference plane Rop. In the optical module having the front wall 15b inclined at an angle of which is not perpendicular to the front wall 15b, in particular, an acute angle, this inclination allows the front wall 15b to refract the incident light beam I of the semiconductor optical device 19 at the incident and emission faces of the front wall 15b, and these refractions change the traveling directions of the light beam I, so that the incident and refracted light beams I propagate at different levels one of which deviates from the optical reference plane Rop.

The cap 15 further includes a first side wall 15*d* and a second side wall 15*e*, which extend in the direction of the first axis Ax 1. Specifically, the cap 15 may have, for example, a cap base 23 made of silicon. The cap base 23 has basal portions of the ceiling 15*a*, the front wall 15*b*, the rear wall 15*c*, the first side wall 15*d* and the second side wall 15*e*. The front wall 15*b*, the first side wall 15*d*, the second side wall 15*e* and the rear wall 15*c* are located on the second area 17*d* of the bench part 13.

In the present embodiment, the first side wall 15*d* and the second side wall 15*e* are connected to one and the other ends of the front wall 15 *b*, respectively, and are connected to one and the other ends of the rear wall 15*c*. The upper ends of the front wall 15 *b*, the rear wall 15*c*, the first side wall 15*d*, and the second side wall 15*e* are connected to the ceiling 15*a* to form the cavity 25, which is defined by the ceiling 15*a*, the front wall 15*b*, the rear wall 15*c*, the first side wall 15*d* and the second side wall 15*e*.

The bench part 13 may include electrodes 31*a* and 31*b*, which are connected to the semiconductor optical device 19. The electrodes 31*a* and 31*b* are disposed on the first area 17*c* and the second area 17*d*. The electrodes 31*a* and 31*b* may extend across the boundary 17*e* between the first area 17*c* and the second area 17*d*, whereby the electrodes 31*a* and 31*b* allow the semiconductor optical device 19 on the first area 17*c* to make the electrical connection on the second area 17*d*. The cap 15 includes pad electrodes 24 provided on the cap base 23, and conductors 26 connected to the pad electrodes 24 on the cap base 23. The conductors 26 on the cap base 23 are electrically connected on the second area 17*d* of the bench 17 to the electrodes 31*a* and 31*b*.

The optical module 11 provides the bench part 13 with the electrodes 31*a* and 31*b* on the first area 17*c* and the second area 17*d*, a semiconductor optical device 19 on the electrode 31*a* in the first area 17*c*, and the lens 21*a* supported by the first area 17*c*. The electrodes 31*a* and 31*b* of the bench part 13 extend on the principal surface 17*a* of the bench 17 (the first area 17*c* and the second area 17*d*), so that the orientations of the principal surface 17*a* of the bench 17 and the extending plane along which the electrodes 31*a* and 31*b* extend on the principal surface 17*a* are related to the optical coupling direction of the optical module 11 in mounting the optical module 11. The electrodes 31*a* and 31*b* of the bench part 13 are electrically connected on the second area 17*d* of the bench 17 to the respective conductors 26 on the cap base 23 of the cap 15. The optical module 11 is electrically connected to an external device at the pad electrodes 24 connected to the conductors 26 of the cap 15, instead of at the electrodes 31*a* and 31*b* disposed on the bench part 13. Providing the pad electrodes 24 on the cap 15 in the optical module 11 can reduce the constraints on the orientation of the optical coupling of the optical module 11 in mounting the optical module 11.

In the optical module 11 having the front wall 15*b* inclined with respect to the optical reference plane Rop, the front wall 15*b* of the cap 15, the semiconductor optical device 19, and the lens 21*a* are arranged along the optical reference plane Rop, and this arrangement allows the semiconductor optical device 19 to optically couple to the front wall 15*b* of the cap 15 through the optical component 21, such as the lens 21*a*. Further, the front wall 15*b* of the cap 15 is transparent to the light beam I to/from the semiconductor optical device 19, and the light beam I, which passes therethrough, is refracted at the front inner and outer faces 15*f* and 15*g* of the front wall 15*b* that extends along the second reference plane R2. The second reference plane R2 for the front wall 15*b* is inclined at an angle of greater than zero degrees with respect to the first reference plane R1 and the optical reference plane Rop. Specifically, the front inner face 15*g* of the front wall 15*b* has a portion extending along the first inner reference plane R11 which is inclined at an acute angle with respect to the first reference surface R1 and the optical reference plane Rop, and the front outer face 15*f* of the front wall 15*b* may have a portion extending along the first outer reference plane R12 which is inclined at an acute angle with respect to the first reference plane R1 and the optical reference plane Rop. In the front wall 15*b* in which the angle ACUT2 is less than 90 degrees, as shown in FIG. 2, the inclination of the front wall 15*b* makes a point P2 of the intersection of the front inner face 15*g* of the front wall 15*b* with the optical axis of the light beam I higher than a point P1 of the intersection of the front outer face 15*f* of the front wall 15*b* with the optical axis of the light beam I in the direction of the normal direction of the principal surface 17*a* of the bench 17. The difference in height (the shift SHF) makes it possible to separate the intersecting position P1 from the tip TIP of the front wall 15*b* (e.g. the cut end) in the direction of the normal direction of the principal surface 17*a* of the bench 17. Although an optically non-uniform shape is likely to be formed at the tip TIP of the front wall 15*b* in the production of the cap 15, the inclination of the front wall 15*b* can prevent the non-uniform shape in the front wall 15*b* from disturbing the light beam I, passing therethrough, to/from the semiconductor optical device 19.

Further, the end of an inclined portion of the front outer face 15*f* is more separated from the principal surface 17*a* of the bench 17 than that of the inner face 15*g* of the front wall 15*b*. In contrast, the end of an inclined portion of the front inner face 15*g* of the front wall 15*b* is closer to the principal surface 17*a* of the bench 17 than the end of the outer face 15*f*. The difference in position between these ends (the difference in height between the ends) is associated with the method of making the cap 15, which will be described below. The light beam I of the semiconductor optical device 19 propagates through the optical component 21 mounted on the principal surface 17*a* of the bench 17, so that the actual optical path of the light beam I is near the principal surface 17*a* of the bench 17. The front wall 15*b* having a desired thickness TH and a desired slope allows the incidence and exit levels of the light passing through the front wall 15*b* to become different from each other because of the refractions of light passing through the front wall 15*b*. The thickness TH of the front wall 15*b* can be, for example, about 100 μm, and may range for example, from 50 to 300 μm.

FIG. 3 is a schematic drawing showing an exemplary optical device including the optical module according to the present embodiment. The optical apparatus DEV comprises an optical module 11 described as any one of configurations according to the present embodiment, an optical part 49 which supports the front wall 15*b* of the optical module 11. The optical part 49 is optically coupled to the semiconductor optical device 19 through the front wall 15*b* of the optical module 11, and the light beam I to/from the semiconductor optical device 19 can pass through the front wall 15*b* of the cap 15. The optical apparatus DEV makes it possible to optically couple the optical module 11 to the optical part 49 via the front wall 15*b* of the optical module 11, and makes electrical connection to the optical module 11 by use of the pad electrodes 24 on the cap 15 of the optical module 11. The front wall 15*b* of the optical module 11 is supported by the principal surface 49a of the optical part 49 via a fixing member 50 including refractive index adjusting material and/or adhesive.

The optical part 49 may include a semiconductor integrated device, such as a silicon photonics devices, and the optical part 49 (for example, a semiconductor integrated device) includes an optical coupling device, such as a grating coupler 49cp, which is to be optically coupled to the semiconductor optical device 19. The slope of the front wall 15b (15f, 15g) with respect to the optical reference plane Rop of the optical module 11 allows the angle ACP between the optical reference plane Rop and the normal axis NX of the principal surface 49a to match with a coupling angle of the optical coupling device, for example, the grating coupler 49cp in the semiconductor integrated device. The angle ACP for the grating coupler 49cp is, for example, in the range of 5 to 15 degrees, and the present embodiment is not limited thereto. The optical apparatus DEV allows the optical part 49, for example, a semiconductor integrated device to be optically coupled with the optical module 11, and allows the external device to be electrically connected to the electrode pads 24 on the rear outer face 15h of the rear wall 15c of the optical module 11 via a wiring member, such as a bonding wire 48 in the present embodiment. In a preferred embodiment, the rear outer face 15h of the rear wall 15c of the optical module 11 can be substantially parallel to the front outer face 15f (e.g., within a range of −10 to +10 degrees). In the assembly form in which the optical module 11 is supported at the front outer face 15f of the front wall 15b, providing the pad electrodes 24 on the rear outer face 15h of the rear wall 15c makes it possible to facilitate the electrical connection to the optical module 11. The angle ACP specifically depends upon the inclination of the front wall 15b of the cap 15, and the tilt angle of the slope of the front wall 15b depends upon crystal plane orientation of a principal surface of semiconductor to be used to form the cap base 23 of the cap 15.

As shown in FIGS. 1 and 2, the semiconductor optical device 19 and the lens 21a are sealed with the cap 15 on the second area 17d of the bench part 13. The bench part 13 supports the front wall 15b, the first side wall 15d, the second side wall 15e and the rear wall 15c of the cap 15 on the second area 17d to seal the semiconductor optical device 19 and the lens 21a.

In the optical module 11, the electrodes 31a and 31b extend on the principal surface 27a of the base 27 from the first area 17c to the second area 17d across the boundary 17e between the first area 17c and the second area 17d. The bench part 13 is provided with an insulating film 29 for insulation and hermetic sealing, and the insulating film 29 is provided on the electrodes 31a and 31b in the second area 17d. Specifically, the insulating film 29 extends on a closed line in the principal surface 27a of the base 27 along a front edge 27b, a first side edge 27c, a second side edge 27d, and a rear edge 27e of the principal surface 27a to form a stripe-shaped layer. In the present embodiment, the stripe-shaped insulating film 29 extends provided on the boundary 17e between the first area 17c and the second area 17d. The insulating film 29 can be, for example, silicon-based inorganic or insulating film, and can be specifically $SiO_2$, SiN, SiON or other materials. On the insulating film 29, a lower metal layer 39 for hermetic sealing is provided. The lower metal layer 39 also extends in a stripe shape along the closed line on the principal surface 27a of the base 27. The lower metal layer 39 is provided on the insulating film 29, and the insulating film 29 is provided over the electrodes 31a and 31b so as to insulate the electrodes 31a and 31b from the lower metal layer 39.

As shown in FIG. 2, the outer surface of the cap base 23 of the ceiling 15a, and the outer surface of the cap base 23 of the front wall 15b are covered with an outer protective film 41 except for the front end TIP of the front wall 15b of the cap 15, the outer side face of the rear wall 15c, the outer face of the first side wall 15d, and the outer side face of the second side wall 15e (which are formed by cutting). In addition, the inner face of the cap base 23 of the ceiling 15a (the ceiling face of the cavity), the inner face of the cap base 23 of the front wall 15b (the front face of the cavity), the lower end face of the cap base 23 of the front wall 15b, the inner face of the cap base 23 of the rear wall 15c (the rear face of the cavity) and the lower end face of the cap base 23 of the rear wall 15c, the inner face of the cap base 23 of the first side wall 15d (the side face of the cavity), and the inner face of the cap base 23 of the second side wall 15e (the other side face of the cavity) are covered with an inner protective film 43. The outer protective layer 41 and the inner protective layer 43 preferably each comprise a dielectric film which can act as an antireflection film on the silicon base. These dielectric films can reduce optical loss caused by the front wall 15b in the exit/incidence of light which passes through the front wall 15b.

The cap 15 is provided on the inner protective film 43, and includes an upper metal layer 45 for hermetic sealing. The upper metal layer 45 is provided on the inner protective film 43 covering the lower end face of the cap base 23 of the front wall 15b, the lower end face of the cap base 23 of the rear wall 15c, the lower end face of the cap base 23 of the first side wall 15d, and the lower end face of the cap base 23 of the second side wall 15e. The upper metal layer 45 may have a strip-shaped pattern, like the lower metal layer 39 of the bench part 13, which extends along a closed line on the above-mentioned lower end faces of the cap base 23.

If necessary, the lower metal layer 39 of the bench part 13 and the upper metal layer 45 of the cap 15 are joined together with a metal body 47, such as a solder material, and the cavity 25 in the assembly of the bench part 13 and the cap 15 is air-tightly sealed. In the optical module 11, the rearmost end 27e of the bench part 13 is positioned at the same position as that of the rearmost end of the rear wall 15c of the cap 15, alternatively may be disposed at a position separated forward from the rearmost end of the rear wall 15c of the cap 15, as shown in FIGS. 1 and 2.

Figure 4A:
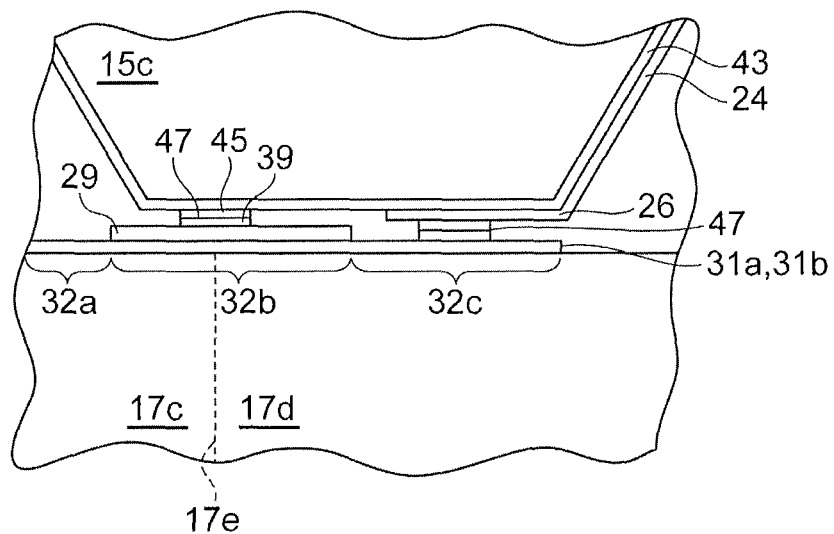
FIGS. 4A and 4B are views each showing a structure for hermetic sealing and electrical connection in the vicinity of the rear wall.
Figure 4B:
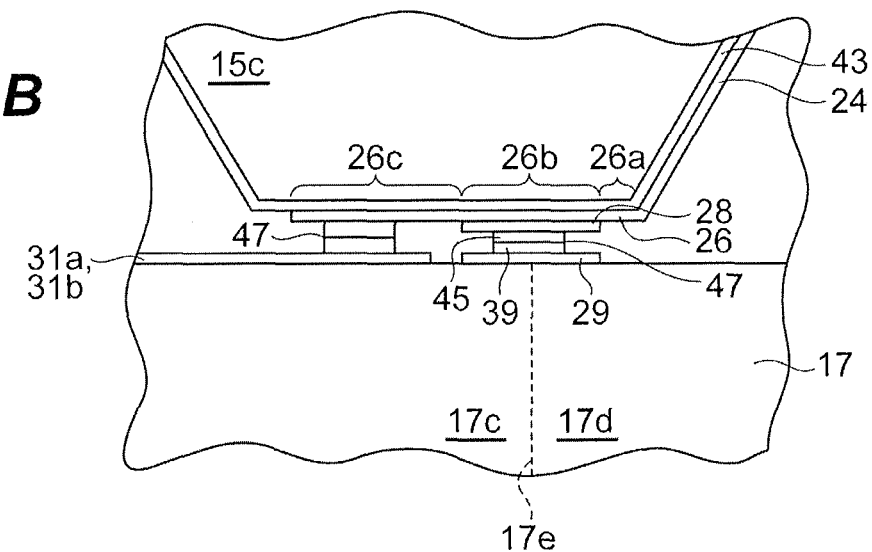

FIGS. 4A and 4B are schematic views each showing a structure for hermetic sealing and electrical connection in the vicinity of the rear wall. FIG. 4A shows an interconnect structure in the optical module 11 shown in FIGS. 1 and 2. Each of the electrodes 31a and 31b includes a first portion 32a, a second portion 32b and a third portion 32c. Since the insulating layer 29 extends across the second portion 32b, the lower metal layer 39 for sealing is isolated from the electrodes 31a and 31b. Specifically, the first portion 32a extends on the first area 17c so as to be connected to the second portion 32b, and the second portion 32b is connected to the third portion 32c. The third portion 32c is connected on the second area 17d to the conductor 26 of the cap 15. The present optical module 11 can provide not only the connection between the electrodes 31a and 31b and the pad electrodes 24 and conductors 26 but also the sealing.

FIG. 4B shows another interconnect structure for the optical module 11 shown in FIGS. 1 and 2. Each of the conductors 26 of the cap 15 includes a first portion 26a, a second portion 26b and a third portion 26c. The cap 15 is provided with an insulating layer 28, and the insulating layer 28 has the same role as the insulating layer 29 of the bench part 13. The insulating layer 28 extends on the boundary 17e between the first area 17c and the second area 17d of the bench part 13, and is provided on the lower end face of the rear wall 15c. The insulating layer 28 extends across the second portion 26b of the conductor 26 such that the upper metal layer 45 for sealing is insulated from the conductor 26. The first portion 26a of the conductor 26 connects the pad electrode 24 to the second portion 26b. The second portion 26b and the third portion 26c of the conductor 26 are connected to each other. The third portion 26c is connected on the first area 17c to each of the electrodes 31a and 31b. The present optical module 11 can provide not only the connection between the electrodes 31a and 31b and the pad electrodes 24 and conductors 26 but also the sealing.

Referring again to FIGS. 1 and 2, the bench 17 includes a base 27 made of silicon. The principal surface 17a of the bench 17 (specifically, the base 27) has a first recess 33 for positioning the lens 21a, such as ball lens, and a second recess 35 for receiving the optical isolator 21b therein. The first recess 33 and the second recess 35 are produced by processing a silicon base 27.

The lens 21a and the optical isolator 21b are secured to the bench 17 by an adhesive member, such as, an epoxy-based adhesive. The semiconductor optical device 19 is bonded to the electrode 31a of the bench 17 by, for example, a solder material (AuSn solder). The semiconductor optical device 19 is connected to the electrode 31b through the connecting conductors 32, such as a bonding wire. The lens 21a is used for condensing or collimating a light beam to/from the semiconductor optical device 19.

In the cap base 23 made of silicon single crystal, the inner face of the cap base 23 of the front wall 15b, the inner face of the base 23 of the rear wall 15c, the inner face of the cap base 23 of the first side wall 15d, the inner face of the cap base 23 of the second side wall 15e may include a silicon (111) plane. This structure can be fabricated using a silicon substrate having a principal surface with a silicon (001) plane. The optical module 11 can be optically connected to an external device through the side face of the cap 15 rather than the back surface of the substrate.

The present embodiment as described above shows that the optical module 11 can reduce the constraints on the orientation of the optical coupling of the optical module 11.

Subsequently, major steps in a method for producing an optical module 11 will be described below. For ease of understanding, where possible, the reference numerals in the description of the optical module 11 made with reference to FIGS. 1 to 3, 4A and 4B will be used in the subsequent description of the production method. With reference to FIGS. 5, 6, 7, FIGS. 8A, 8B and 8C, FIG. 9, and FIG. 10 each showing a cross section corresponding to that in FIG. 2, the step of preparing the bench product for the bench part 13 will be described. As can be understood from the subsequent description, an example of the preparation is to perform the production of a bench product.

In step S101, as shown in FIG. 5, the silicon wafer 51 is prepared as a single crystal semiconductor substrate. The silicon wafer 51 has a principal surface 51a and a back surface 51b, and the principal surface 51a may comprise, for example, a (001) plane. The silicon wafer 51 has a size (e.g., 6 inches), which can include an array of sections (to which the following processes are applied to form a substrate product for the bench 17), and is, for example, 725 μm thick. In each section in the array, the principal surface 51a has a first area 51c, a second area 51d, a third area 51e, and a fourth area 51f. The third area 51e and the fourth area 51f include a cutting margin for cutting. As shown in part (a) of FIG. 5, a first insulating film 53, such as silicon oxide film, is formed on the principal surface 51a of the silicon wafer 51. In the present embodiment, the rear surface 51b of the silicon wafer 51 is not covered with an insulating film, and if needed, an insulation film can be formed on the back surface 51b.

In step S102, a first recess 33 for positioning the lens 21a is formed in the first area 51c of each section of the silicon wafer 51 in the present embodiment. As shown in part (b) of FIG. 5, a first recess mask 53a which defines a first recess 33 for positioning the lens 21a is produced from the first insulating film 53 using photolithography. As shown part (c) of in FIG. 5, the silicon single crystal appearing at the first opening 53b of the first recess mask 53a is wet-etched to KOH solution used as etchant to form a first recess 33 in the first area 51c. The shape of the first opening 53b has for example, a rectangular or square due to the four-fold symmetry of silicon, and in the present embodiment, has a square that includes a pair of sides extending in the <110> axial direction of the silicon crystal and another pair of sides extending in the <11-0> axial direction. After the first recess 33 has been formed, as shown in part (d) of FIG. 5, the first recess mask 53a is removed.

In step S103, after the removal of the first recess mask 53a, as shown in part (a) of FIG. 6, a second insulating film 55, such as silicon oxide film, is formed on the principal surface 51a of the silicon wafer 51. In order to avoid etching of the back surface 51b of the silicon wafer 51, an insulating film, such as silicon oxide film, may be formed on the back surface 51b.

In step S104, a second recess 35 for receiving the optical isolator 21b in the present embodiment is formed in the first area 51c in each section of the silicon wafer 51. As shown in part (b) of FIG. 6, a second recess mask 55a which defines the second recess 35 for positioning the optical isolator 21b is produced from the second insulating film 55 using photolithography. As shown in part (c) of FIG. 6, the silicon single crystal appearing at the second opening 55b of the second recess mask 55a is dry-etched to form a second recess 35 next to the first recess 33. The shape of the second opening 55b has, for example a square, rectangular or other shapes, and in the present embodiment, comprises a square with a pair of sides extending in the <110> axial direction of the silicon crystal and another pair of sides extending in the <11-0> axial direction. After the second recess 35 has been formed in the first area 51c, as shown in part (d) of FIG. 5, the second recess mask 55a is removed to produce a support from form the single crystal silicon substrate.

Figure 7:
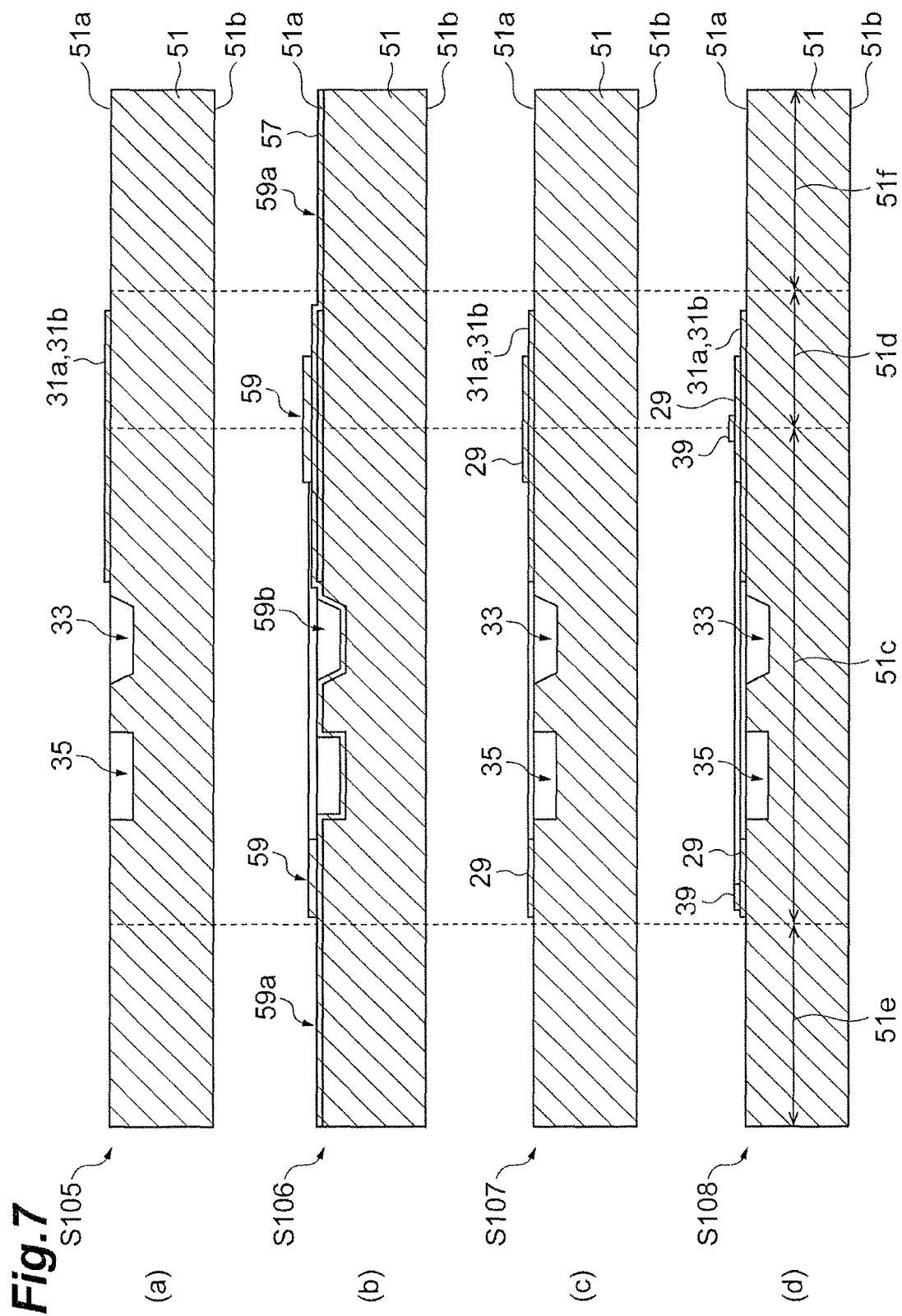
FIG. 7 shows major steps in the method of making a bench product according to the present embodiment.

In step S105, as shown in part (a) of FIG. 7, electrodes 31a and 31b are formed in the first area 51c and the second area 51d. In the present embodiment, the electrode 31a and 31b are formed by a lift-off method. More specifically, a sacrificial layer having a pattern for lift-off is formed on the wafer, and a metal film is grown thereon by vapor deposition. The sacrificial layer may be a resist film, and the metal film comprises, for example, a Ti/Pt/Au (100 nm/200 nm/500 nm). After the growth of the metal film, the silicon wafer 51 is immersed in a remover solution for the sacrificial layer to perform the lift-off of the metal film.

In step S106, an insulating layer 29 for insulation and hermetic sealing is formed. As shown in part (b) of FIG. 7, an insulating film 57 (e.g., $Si_3N_4$ with a thickness of 500 nm) for the insulating layer 29 is grown by chemical vapor deposition (CVD) method. A sealing mask 59 having a sealing pattern is formed on the insulating film 57 by photolithography and etching. In part (b) of FIG. 7, the sealing mask 59 are depicted along with the first opening 59a and the second opening 59b, and the sealing mask 59, shown in the cross section, has a stripe shape, which corresponds to that of the insulating layer 29, extending on a closed loop for sealing in each section.

In step S107, as shown in part (c) of FIG. 7, the insulating film 57 is subjected to dry etching using an etchant ($CF_4$) with the sealing mask 59 to form the insulation layer 29 on the first area and on the boundary between the first area and the second area, and after the etching, the sealing mask 59 is removed by a remover solution.

In step S108, as shown in part (d) of FIG. 7, a sealing member is formed. The sealing member may be made of, for example, a metal member, an organic resin or other materials. The sealing member to be formed in the present embodiment includes a metallic material. Specifically, the lower metal layer 39 for the hermetic sealing is formed by a lift-off method. More specifically, a sacrificial layer with a pattern for lift-off is formed the silicon wafer 51, and a metal film is grown on the sacrificial layer by vapor deposition. The sacrificial layer may be a resist film, and the metal film thus grown may be made of a Ti/Pt/Au (100 nm/200 nm/50 nm). After the metal film has been deposited, the silicon wafer 51 is immersed in a remover solution for the sacrificial layer to perform the lift-off of the metal film, thereby forming a patterned metal film, for example, the lower metal layer 39 in the present embodiment, on the insulating layer 29 for each section.

In step S109, the die bonding of the semiconductor optical device 19 is carried out. As shown in FIG. 8A, a patterned solder 39 is formed for die bonding of the semiconductor optical device 19 by a lift-off method. More specifically, a sacrificial layer with a pattern for lift-off is formed on the silicon wafer 51, and a metal film is grown thereon by vapor deposition. The sacrificial layer may be a resist film, and the metal film, for example, a AuSn solder with a thickness of 2 μm is deposited thereon. After the metal film has been formed on the silicon wafer 51, the silicon wafer 51 is immersed in a remover solution from the sacrificial layer to lift off the metal film. The next step is, as shown in FIG. 8B, to perform the die bonding of the semiconductor optical device 19. Specifically, a laser diode is positioned on the fixing solder 39. The work temperature for soldering is, for example, 330 degrees Celsius. After the die bonding of the semiconductor optical device 19 has been performed, the upper electrode of the semiconductor optical device 19 is connected to the electrode 31b with a gold wire 63 by wiring.

Figure 9:
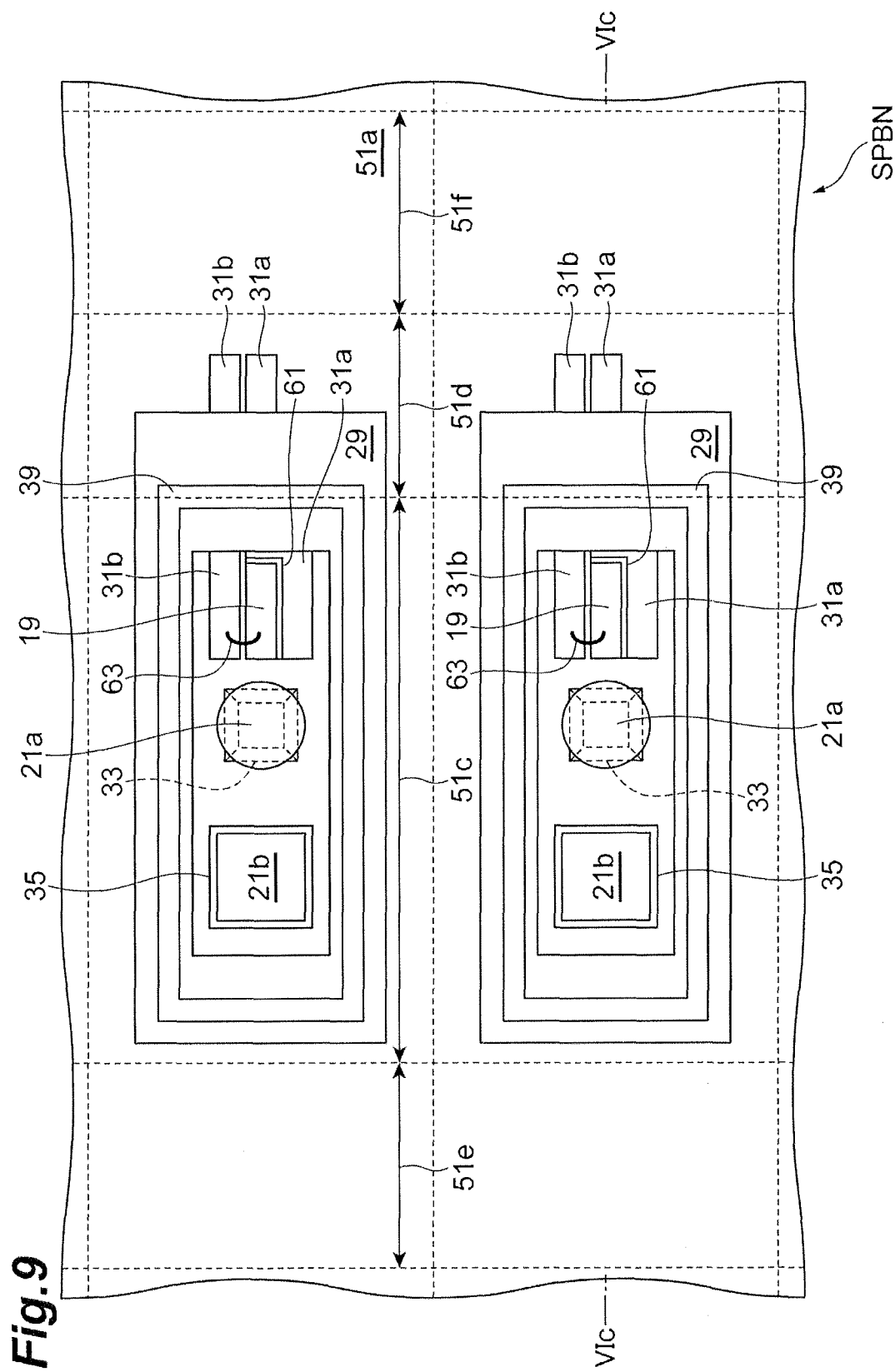
FIG. 9 is a schematic plan view showing two sections on a primary surface of a wafer product in the method of making a bench product according to the present embodiment.

In step S110, as shown in FIGS. 9 and 8C, mounting the optical component 21 is performed. In the present embodiment, a ball lens and an isolator are arranged in the first recess 33 and the second recess 35, respectively. The bonding of the optical component 21 is performed with an adhesive member 65, such as epoxy adhesive. FIG. 8C shows a cross section taken along the VIc-VIc line shown in FIG. 9.

Carrying out the above steps brings a bench product SPBN to completion, and the bench product SPBN comprises an array of sections for the bench part 13. FIG. 9 is a schematic plan view showing a typical two sections in step S110. The bench product SPBN comprises the silicon wafer 51, acting as a support, to which the above processes has been applied, and each section is provided with the semiconductor optical device 19 and the optical component 21 on the principal surface of the support. Further, the bench product SPBN has a structure for hermetic sealing.

In the subsequent description, with reference to FIGS. 11, 13, 14, 16, and 17B, and FIGS. 10, 12, FIGS. 15A, 15B and 15C, and FIG. 17A each of which shows a cross section corresponding to that shown in FIG. 2, a process of preparing a cap product for the cap 15 will be described below. As will be understood from the subsequent description, producing a cap product will be described as an example of the preparation.

Figure 10:
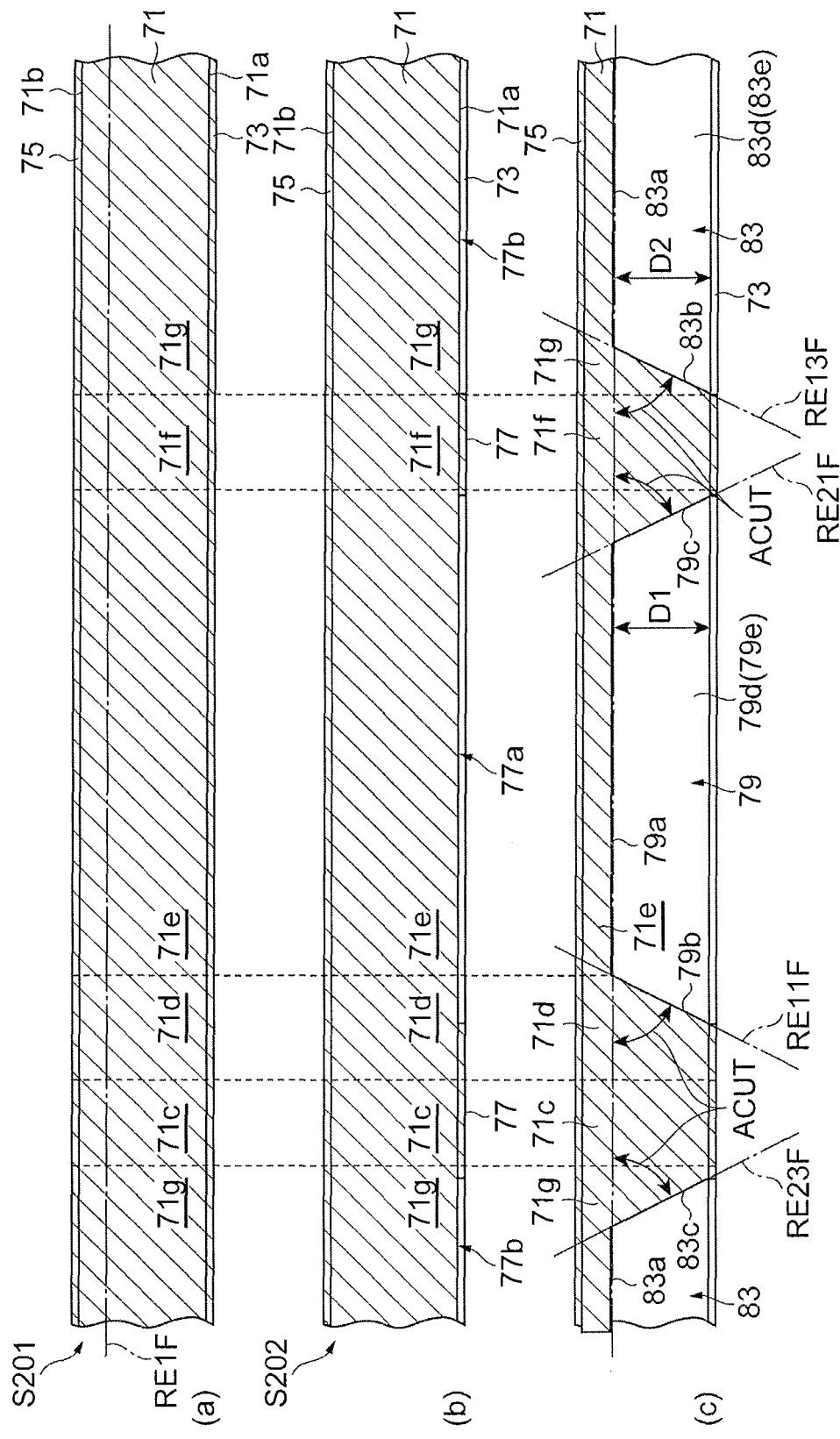
FIG. 10 shows cross sectional views, taken along a line corresponding to the cross section shown in FIG. 2, illustrating major steps in the method of making a cap product for a cap component.

In step S201, as shown in part (a) of FIG. 10, a silicon wafer 71 is prepared as a single crystal semiconductor substrate. The thickness of the substrate can be, for example, 725 micrometers. The silicon wafer 71 has a first surface 71a and a second surface 71b, and the first surface 71a and second surface 71b of the silicon wafer 71 is preferably parallel to each other. In the present embodiment, each of the first surface 71a and the second surface 71b comprises, for example, (001), but is not limited thereto. The selection of the plane orientation is related to the angle ACP. Each of the first surface 71a and the second surface 71b comprises, for example, a (001) plane, and has an angle ranging from −1 degrees to +1 degrees with respect to the (001) plane. The first surface 71a is opposite to the second surface 71b. The silicon wafer 71 has a size (e.g., 6 inches) enough to have an array of sections (sections for making a cap base 23 for a single cap). In each section in the array, the silicon wafer 71 of the single crystal semiconductor substrate has a first region 71c, a second region 71d, a third region 71e, a fourth region 71f and a fifth regions 71g for each section. The first region 71c, the second region 71d, the third region 71e, the fourth region 71f and the fifth region 71g are arranged along a first reference plane RE1F. A third insulating film 73 and a fourth insulating film 75 are formed on the first surface 71a and the second surface 71b of the silicon wafer 71, respectively. Each of the third insulating film 73 and the fourth insulating film 75 can comprise, for example, a silicon oxide film.

An inner opening and a first outer opening are formed on the first surface 71a of the silicon wafer 71, and a second outer opening is formed on the second surface 71b of the silicon wafer 71. In the present embodiment, the formation of the inner opening and the first outer opening may be followed by the formation of the second outer opening. But, the second outer opening may be formed prior to form the inner opening and the first outer opening.

Figure 11:
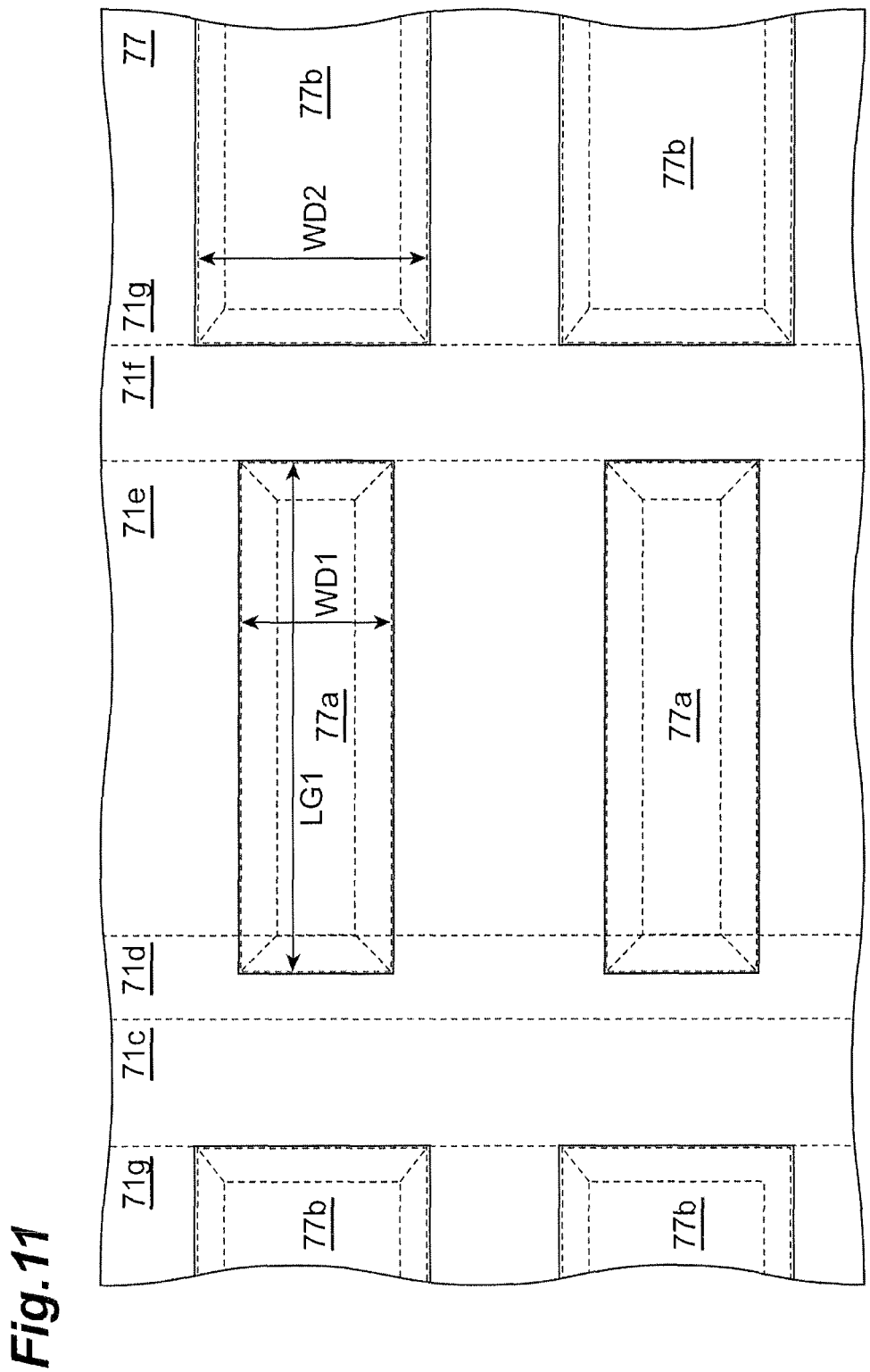
FIG. 11 is a top view showing a major step in the method of making a cap product according to the present embodiment.
Figure 12:
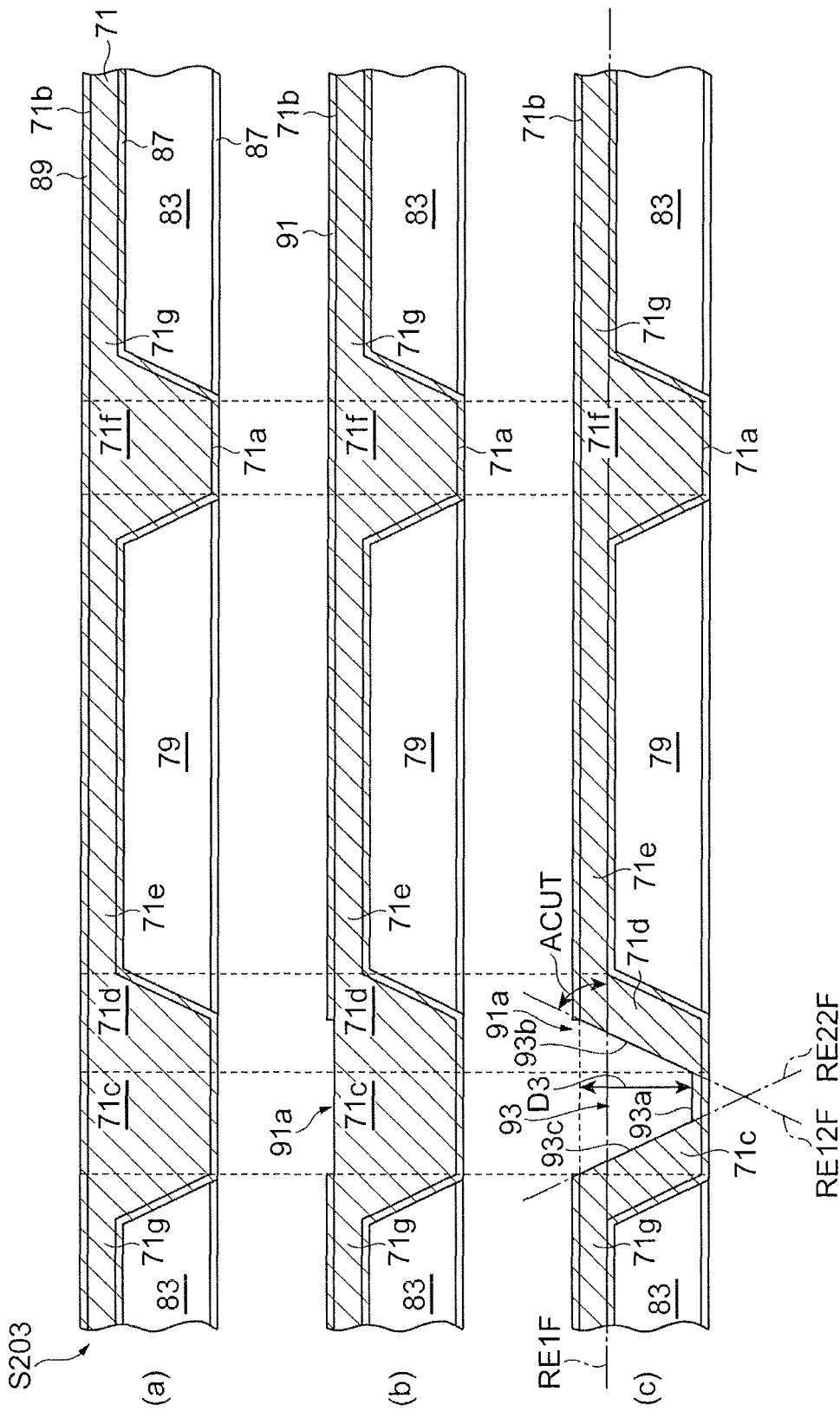
FIG. 12 shows major steps in the method of making a cap product according to the present embodiment.

In step S202, an array of internal openings each of which is prepared for the cavity 25 of the cap 15 is formed in the second region 71d and the third region 71e for each section of the silicon wafer 71, and an array of first outer openings each of which is prepared for the rear walls 15c is formed in the fifth area 71g for each section of the silicon wafer 71. As shown in part (b) of FIG. 10, the application of photolithography and etching forms a first mask 77 on the first surface 71a. The first mask 77 includes a first opening pattern 77a for an internal opening used to provide the cavity 25, and a second opening pattern 77b for a first outer opening used to provide the rear wall 15c. FIG. 11 is a drawing showing a first mask 77 formed on the first surface 71a of the silicon wafer 71. In FIG. 11, the inner opening and the second outer opening that are to be formed are shown by respective broken lines, which are drawn inside along the solid lines indicating the first and second opening patterns 77a and 77h. Each first opening pattern 77a extends in a direction of one of the <110> and <11-0> axes and has a shape of a stripe pattern in each section, in particular, a rectangle shape. Each first opening pattern 77a has a first length LG1 and a first width WD1, which relates to the size of the cavity 25. The second opening pattern 77b also extends in the direction of the one of the <110> and <11-0> axes, and has a shape of a stripe pattern in each section, in particular, a rectangle shape. In order to provide the rear wall 15c with a width sufficient to dispose the pad electrodes 24 on the cap 15, the second width WD2 of the second opening pattern 77b is made larger than the first width WD1 of the first opening pattern 77a. In the present embodiment, the first opening pattern 77a has a rectangular shape, provided in each section, with a pair of sides extending in the direction of the <110> axis of, for example, a silicon crystal, and another pair of sides extending in the direction of the <11-0> axis, and the second opening pattern 77b has a rectangular shape, provided in each section, with a pair of sides extending in the direction of the <110> axis of, for example, a silicon crystal, and another pair of sides extending in the direction of the <11-0> axis. The first and second opening patterns 77a and 77b may be alternately arranged in one direction (an arranging direction). For example, the second opening pattern 77b may have a stripe-like shape extending across a boundary between adjoining sections in a direction crossing the arranging direction to share with the adjoining sections, without each section being provided with the second opening pattern 77b so as to be paired with the first opening pattern 77a in the every section.

The silicon single crystal appearing at the first and second opening patterns 77a and 77b of the first mask 77 is etched using a KOH solution as an etchant, shown in part (c) of FIG. 10, to form the inner opening 79 and the first outer opening 83, respectively. The inner the opening 79 has a bottom face 79a, a side face 79b and a rear inner face 79c. The bottom face 79a extends along the direction of the first reference plane RE1F. In each section, the first region 71c, the second region 71d, the third region 71e and the fourth region 71f are arranged in this order along the first reference plane RE1F. The bottom face 79a and the rear inner face 79c of the inner opening 79 are provided in the third region 71e, and the rear inner face 79c is not provided in the fourth region 71f. The front inner face 79b of the inner opening 79 is provided in the second region 71d. The front inner face 79b of the inner opening 79 extends along the first inner reference plane RE11F that forms an acute angle ACUT with the first reference plane RE1F, and the rear inner face 79c of the inner opening 79 extends along the second inner reference plane RE21F that forms the acute angle ACUT with the first reference plane RE1. As a result, the inner opening 79 has a trapezoidal form in a longitudinal section form. The inner opening 79 includes a first side face 79d and a second side face 79e, which are prepared for the inner faces of the side walls of the cap. The first side face 79d connects an edge of the front face 79b to one edge of the rear face 79c, and the second side face 79e connects the other edge of front face 79b to the other edge of the rear inner face 79c. In addition, a rear outer side face 83b (the outer face 15h of the rear wall 15c), a bottom face 83a and a rear face 83c of the first outer opening 83 are provided in the fifth area 71g. The rear outer face 83b of the first outer opening 83 extends along a second outer reference plane RE13F which forms an acute angle ACUT with the first reference plane RE1F, and the rear face 83c extends along a third inner reference plane RE23F which forms an acute angle ACUT with the first reference plane RE1F, so that the first outer opening 83 has a trapezoidal longitudinal section. The first outer opening 83 includes a third side face 83d and a fourth side face 83e. The third side face 83d connects an edge of the rear outer face 83b to one edge of the rear inner face 83c, and the fourth side face 83e connects the other edge of one side face 83b to the other edge of the rear inner face 83c.

Specifically, the bottom face 79a of the inner opening 79 is provided with a (001) plane of silicon, the front side face 79b and the rear inner face 79c each include, for example, a silicon (111) plane, and the first side face 79d and the second side face 79e include, for example, a silicon (111) plane. The first depth D1 of the inner opening 79 (for example, a distance between the bottom face 79a and the first face 71a) is, for example, 650 µm, which is defined as a distance to the first surface 71a, and can be a range of 500 to 700 µm. The second depth D2 of the first outer opening 83 (e.g. the distance between the bottom face 83a and the first surface 71a) can be substantially the same depth as the first depth D1. Further, the bottom face 83a of the first outer opening 83 is provided with a silicon (001) plane, the side face 83b and the rear inner face 83c include, for example, a silicon (111) plane, and the third side face 83d and the fourth side face 83e include, for example, silicon (111) plane. The formation of the inner opening 79 and the first outer opening 83 is followed by the removal of the first mask 77 and the fourth insulating film 75.

Figure 13:
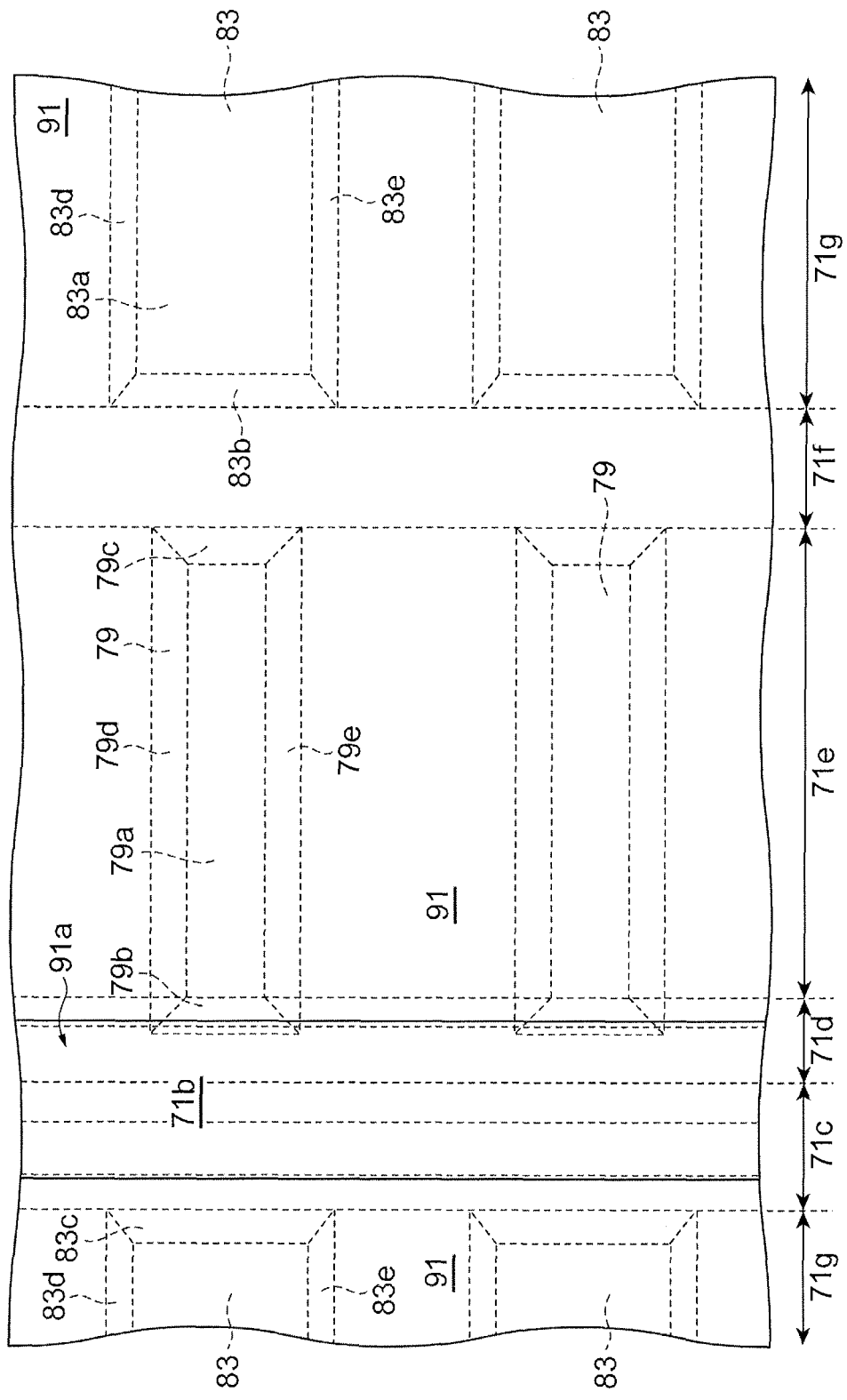
FIG. 13 is a top view showing a major step in the method of making a cap product according to the present embodiment.

In step S203, the arrangement of second outer openings for the front wall of the cap 15 is formed on the second surface 71b of the first region 71c and the second region 71d in each section of the single crystal semiconductor substrate. As shown in part (a) of FIG. 12, a fifth insulating film 87 and a sixth insulating film 89 are grown on the first surface 71a and the second surface 71b of the silicon wafer 71, respectively. Each of the fifth insulating film 87 and the sixth insulating film 89 may comprise, for example, a silicon oxide film. As shown in part (b) of FIG. 12, the application of photolithography and etching processes to the sixth insulating film 89 forms the second mask 91 on the second surface 71b. The second mask 91 has a third opening pattern 91a for a second outer opening formed for an outer face of the front wall 15b of the cap 15. FIG. 13 is a plan view showing a second mask 91 on the second surface 71b of the silicon wafer 71. In FIG. 13, a dashed line drawn inside along the solid line that indicates the third opening pattern 91a shows an outer opening to be formed. The third opening pattern 91a can has a stripe shape extending across a boundary between adjoining sections in a direction of the other of <110> and <11-0> axes (the same direction as the arrangement of the first opening patterns 77a of FIG. 11), and may have a rectangular shape extending in the direction of the other of <110> and <11-0> axes (the same direction as the arrangement of the first opening patterns 77a of FIG. 11). In the present embodiment, the third opening pattern 91a is provided for defining grooves for the front wall 15b used for light emission and/or light reception of the optical module 11, so that the third opening pattern 91a extends to traverse the sections. Wet etching is performed with the second mask 91. As shown in part (c) of FIG. 12, the application of an etching process using KOH solution as an etchant with the second mask 91 to parts of the third silicon single crystal, which appear at the opening pattern 91a of the second mask 91, forms a second outer opening 93. The second outer opening 93 includes a bottom face 93a, a side face 93b and another side face 93c. The bottom face 93a extends in the extending direction of the first reference plane RE1F. The bottom face 93a of the second outer opening 93 is provided in the first region 71c; the side face 93b of the second outer opening 93 is provided in the second region 71d; and the other side face 93c of the second outer opening 93 is provided in the first region 71c. The side face 93b of the second outer opening 93 extends along the first outer reference plane RE12F forming an acute angle ACUT with the first reference plane RE1F, and the other side face 93c of the second outer opening 93 extends along the third outer reference plane RE22F forming an acute angle ACUT with the first reference plane RE1F. The side face 93b and the other side face 93c of the second outer opening 93 each include, for example, a silicon (111) plane, and the bottom face 93a may include a silicon (001) plane. The formation of the second outer opening 93 is followed by removal of the second mask 91 and the fifth insulating film 87. The third depth D3 of the second outer opening 93 (e.g. the distance between the second face 71b and the bottom face 93a) can be, for example, 675 μm, which is defined as a distance to the second surface 71b, and can be in a range of 600 to 700 μm.

Figure 14:
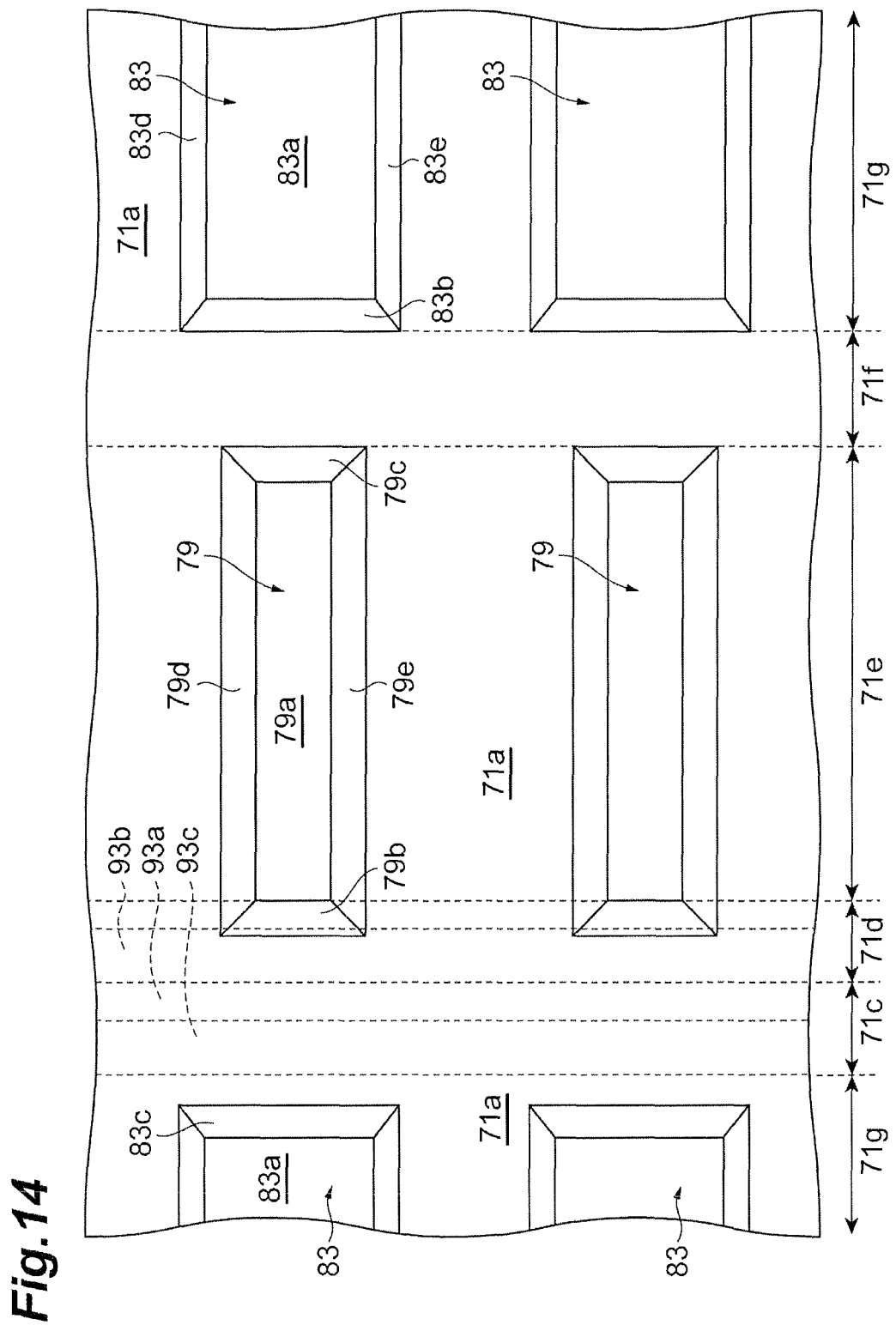
FIG. 14 is a top view showing a major step in the method of making a cap product according to the present embodiment.

FIG. 14 is a plan view showing the first surface 71a of the silicon wafer 71 in the steps by which follows the removal of the insulating film. In the plan view of FIG. 14, the side face 79b overlaps the side face 93b in the second region 71d in position. The overlap length between the inner opening 79 and the second outer opening 93 is associated to the thickness of the front wall 15b of the cap 15 made by the present fabricating method (e.g., thickness TH in FIG. 2), and this thickness relates to the amount of shift of the optical axes (the shift amount SHF in FIG. 2). This shows that the shift amount SHF can be changed depending upon the arrangement of the inner opening 79 and the second outer opening 93. The thickness TH of the front wall 15b can be for example, about 100 μm. The thickness TH is defined in a direction perpendicular to, for example, silicon (111) plane.

After forming the inner opening 79, the first outer opening 83, and the second outer opening 93 in step S204, as shown in FIG. 15A, a seventh insulating film 95a and an eighth insulating film 95b are grown on the first and second face 71a and 71b of the silicon wafer 71, respectively. The seventh insulating film 95a and the eighth insulating film 95b each include an insulating film working as an antireflection film, such as, silicon oxynitride film (SiON). Specifically, the antireflection film ARIN is provided on the side face 79b of the inner opening 79, and the anti-reflection film AROT is also provided on the side face 93b of the second outer opening 93.

After these insulating films have been formed, in step S205, as shown in FIG. 15B, a wiring metal layer 85 is formed for the pad electrodes 24 and the conductors 26. The wiring metal layer 85 includes, for example, gold. More specifically, the wiring metal layer 85 is formed by a lift-off method. The formation of a sacrificial layer having a pattern for lift-off is followed by the growth of metal by a vapor deposition method. The sacrificial layer may be a resist film, and the metal film comprises, for example, a Ti/Pt/Au (100 nm/200 mm/500 nm). After depositing the metal film on the silicon wafer 71, the silicon wafer 71 is immersed in a remover solution for the sacrificial layer to lift off the metal film, thereby forming a patterned metal film, in particular, the patterned wiring metal layer 85 for each section. In the present embodiment, the patterned wiring metal layer 85 is provided on the first surface 71a of the fourth region 71f, and the side face 83b and bottom face 83a of the first outer opening 83. The patterned wiring metal layer 85 extends across the boundary between the fourth area 71f and the fifth area 71g. The patterned metal layer 85 on the first surface 71a of the fourth region 71f is disposed for the conductor 26 for electrical connection, and the patterned metal layer 85 on the side face 83b of the first outer opening 83 is provided for the pad electrodes 24, and if necessary, the patterned metal layer 85 may be formed on the bottom face 83a of the first outer opening 83.

In step S206, as shown in FIG. 15C, a sealing member is formed. The sealing member may be made of, for example, a metal member, an organic resin, or other materials. The sealing member to be formed in the present embodiment includes a metallic material for sealing and bonding. Specifically, the lower metal layer 45 for hermetic sealing and bonding is formed by a lift-off method. More specifically, a sacrificial layer with a pattern for lift-off is formed on the silicon wafer 71, and a metal film is grown thereon by vapor deposition. The sacrificial layer may be a resist film, and the metal film thus grown may be made of, for example, a Ti/Pt/Au/AuSn (100 nm/200 nm/50 nm/2000 nm). After the metal film has been deposited, the silicon wafer 71 is immersed in a remover solution for the sacrificial layer to perform the lift-off of the metal film, thereby forming a patterned metal film, for example, the lower metal layer 45 for each section in the present embodiment. For obtaining an adequate sealing, the size, the position and the shape of the upper metal layer 45 correspond to those of the lower metal layer 39. In the present embodiment, the upper metal layer 45 is formed so as to encircle the inner opening 79 for the cavity 25. The upper metal layer 45 is formed on the fourth wiring metal layer 85 (85a, 85b) on the first surface 71a of the fourth region 71f to obtain an adequate bonding.

Carrying out the above steps brings a cap product SPCP to completion and the cap product SPCP comprises an array of sections each of which is prepared for the cap 15. Assembling the bench product and the single crystal semiconductor substrate subjected to the above processing fabricates an assembly.

Figure 16:
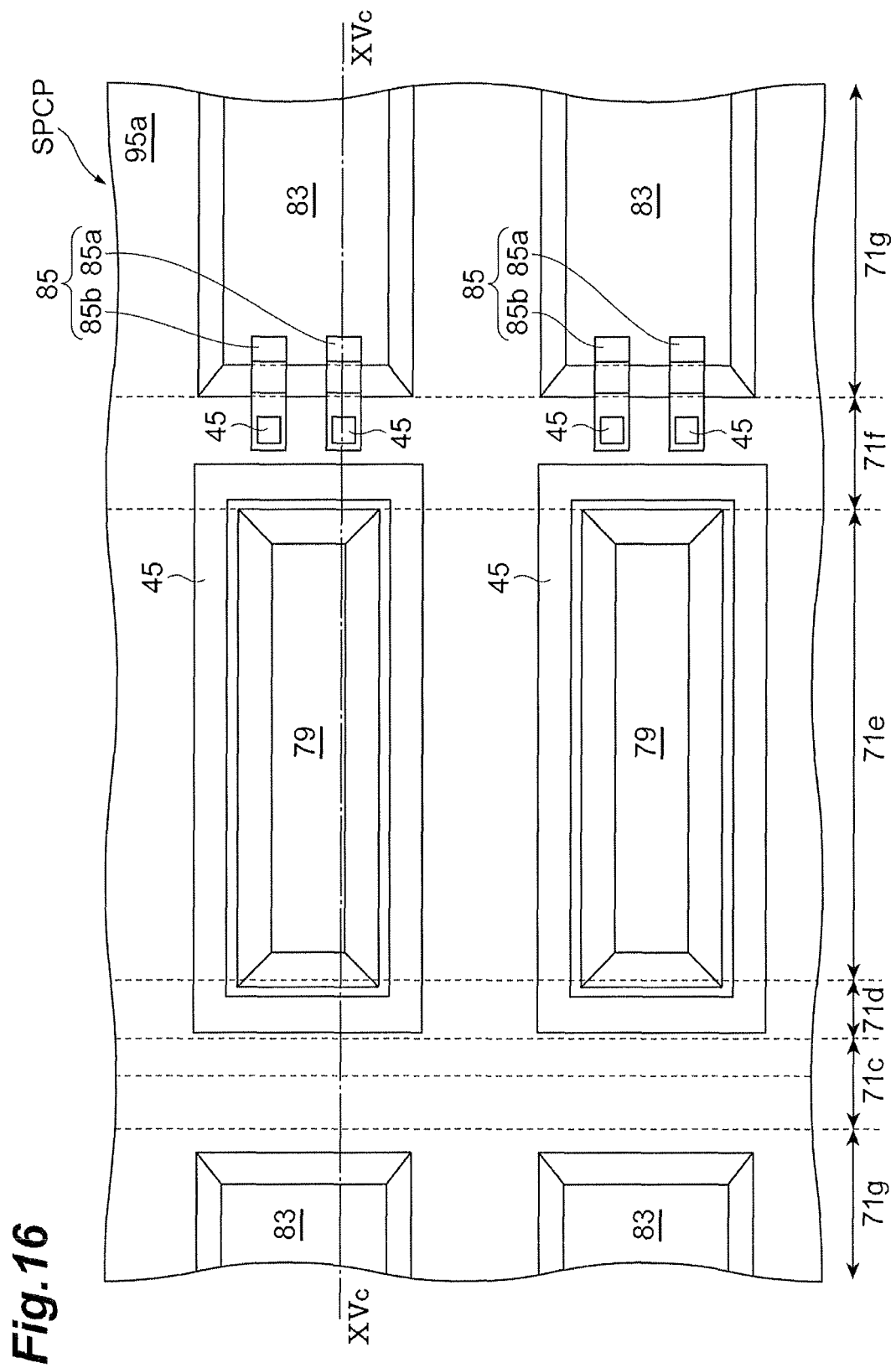
FIG. 16 is a top view showing a first surface of the silicon wafer on which a wiring metal layer and an upper metal layer are formed.

FIG. 16 is a view showing the first surface 71a of the silicon wafer 71 on which the wiring metal layer 85 (85a, 85b) and the upper metal layer 45 have been formed. The line XVc-XVc line in FIG. 16 corresponds to the cross-section shown in FIG. 15C. In FIG. 16, the inner opening 79 on the first surface 71a is shown by a solid line, and the second outer opening 93 on the second surface 71b is shown by a dashed line. The side face 79b of the inner opening 79 and the second side face 93b of the outer opening 93 extend in the same direction, and in a preferred embodiment, the side face 79b and the side face 93b are substantially parallel to each other, and may include for example, a (111) plane.

A process of fabricating an optical module from the bench product SPBN and the cap product SPCP will be described in detail below. FIGS. 17A and 17B schematically show a step of bonding the bench product SPBN to the cap product SPCP. FIG. 17A shows a cross section taken along the XVIIa-XVIIa line in FIG. 17B. As shown in FIGS. 17A and 17B, in step S301, one of the bench product SPBN and the cap product SPCP is disposed on the other such that the front inner faces 79b of the inner opening 79 of the cap product SPCP are aligned with the axis of the arrangement of the semiconductor optical device 19 and the optical component 21, and the heat treatment of the bench product SPBN and the cap product SPCP thus aligned is carried out to make a sealed product, for example, an assembly ASM, which is produced from the bench product SPBN and the cap product SPCP. In the above-described arrangement of the bench product SPBN and the cap product SPCP, the lower metal layer 39 and the upper metal layer 45 are positioned to each other. The application of the heat treatment to the lower metal layer 39 and the upper metal layer 45 forms the joined lower and upper metal layers 39 and 45, so that the sealed cavity 25 is formed in each section and the electrodes 31a and 31b and the wiring metal layer 85 (85a, 85b) are joined together to complete the electrical connection between the cap 15 and the bench part 13. The assembly ASM is provided with both the hermetic sealing and the electrical connection. The cavity 25 provided by the inner opening 79 of the cap product SPCP can accommodate the semiconductor optical device 19, the lens 21a and the optical isolator 21b of the bench product SPBN.

Figure 18:
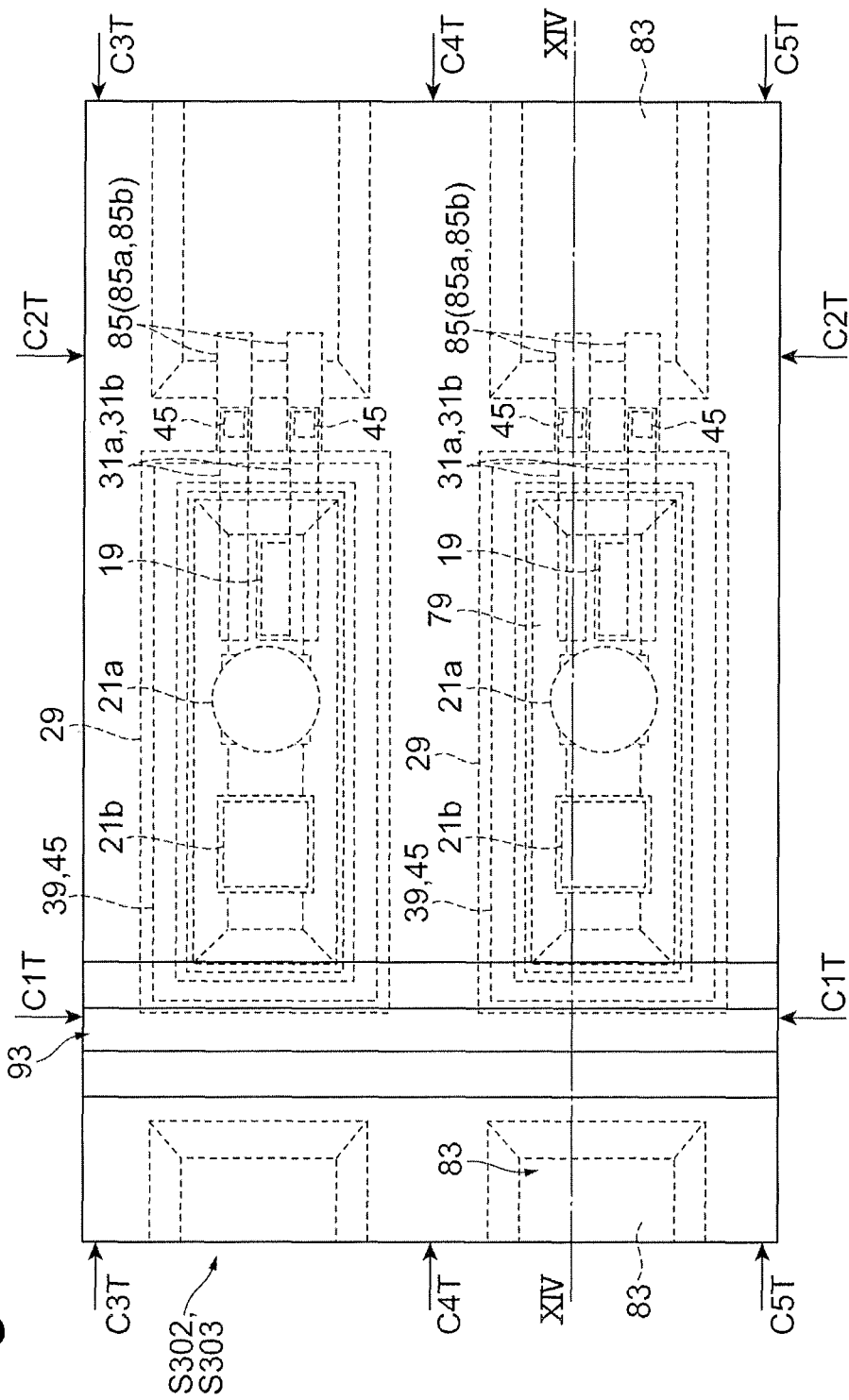
FIG. 18 is a top view illustrating first and second cutting lines C1T and C2T, and third, fourth and fifth cutting lines C3T, C4T and C5T which extend in the first direction in the assembly ASM.

The assembly ASM is cut to form a number of optical modules. FIG. 18 shows the upper surface of the cap product SPCP of the assembly ASM. The second outer opening 93 appears on the upper surface of the cap product SPCP. FIG. 18 shows a first cutting line C1T and a second cutting line C2T which extend on the assembly ASM in a first direction, and a third cutting line C3T, a fourth cutting line C4T and a fifth cutting line C5T whish extend in a second direction perpendicular to the first direction. For example, a process of perform cutting along the first cutting line C1T and the second cutting line C2T are followed by a process of perform cutting along the third cutting line C3T, the fourth cut line C4T and the fifth cutting line C5T to produce the optical module. With this reverse order of these cutting processes, the optical module can be also produced.

Figure 19:
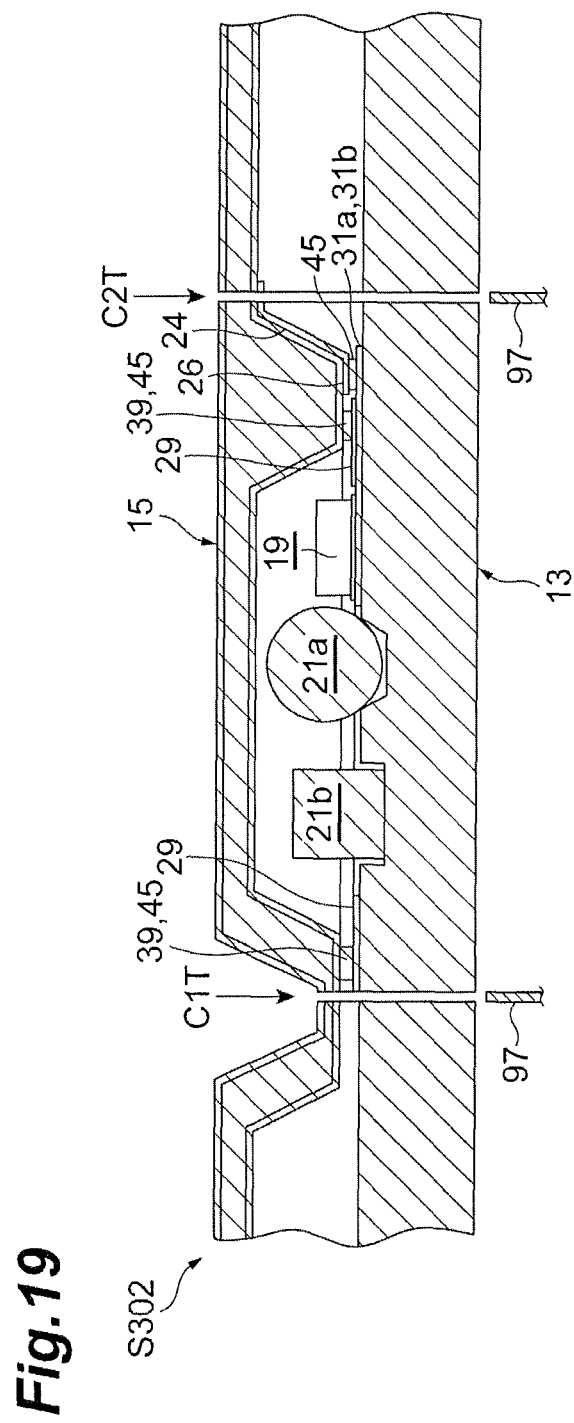
FIG. 19 shows a cross sectional view taken along the line XIV-XIV shown in FIG. 18.

For example, in step S302, the assembly ASM (both of the cap product SPCP and the bench product SPBN) is cut in the first direction indicated by the first and second cutting lines C1T and C2T. This cutting process is performed using a cutting device 97, such as a dicing saw. FIG. 19 shows a cross-section taken along the line XIV-XIV shown in FIG. 18. The first cutting line C1T is defined so as to leave the side 93b of the second outer opening 93. This cutting process eliminates the bottom face 93a of the second outer opening 93. The second cutting line C2T is defined so as to leave the side 83b of the first outer opening 83. The cutting process eliminates the bottom face 83a of the first outer opening 83. In the above process, the front wall 15b, the tip TIP and the rear wall 15c of the front wall 15b for the optical module 11 are formed. The cutting process provides the optical module bars illustrated as one embodiment of an optical module component. Each optical module bar comprises optical modules, which are arranged in one direction to form an one-dimensional array. In the present embodiment, the assembly ASM (including both the cap product SPCP and the bench product SPBN) is cut together, so that the end of the rear wall 15c of the cap 15 is located on the vertical plane on which the rear edge 27e of the bench part 13 is also located. The cap product SPCP and the bench production SPBN of the assembly ASM may be cut separately, and as shown in FIG. 2, the rear edge 27e of the bench part 13 is forward from the rearmost end of the rear wall 15c of the cap 15, thereby making the bonding easy.

In step S303, in the second direction indicated by the third cutting line C3T, the fourth cutting line C4T and the fifth cutting line C5T, respective cuttings of the optical module bar (both of the cap product SPCP and bench production SPBN) are performed. These cuttings are performed using the cutting device 97, such as a dicing saw. The cutting processes allow the production of the optical module from the assembly ASM. FIGS. 20A, 20B and 20C each show an appearance of an optical module produced by these processes. FIG. 20A is a cross sectional view showing the inside of the optical module formed by cutting the optical module bar. FIG. 20B is a front view showing the front of the optical module produced by cutting the optical module bar. FIG. 20C is a rear view showing the rear of the optical module produced by cutting the optical module bar. In the present embodiment, the optical module bar or assembly ASM is cut along the third cutting line C3T, the fourth cut line C4T and the fifth cutting line C5T, which are positioned outside of the inner opening 79 and the first outer opening 83. Accordingly, the rear wall 15c of the cap 15 of the optical module according to the above embodiment has a first protruding wall 15j and a second protruding wall 15k. The first and second protruding walls 15k and 15j protrude outward from the first side wall 15d and the second side wall 15e relative to the rear outer faces 15h, respectively. In terms of the protruding walls, the appearance of the optical module shown in FIG. 20A is different from that of the optical module shown in FIG. 1. Any of the optical modules shown in FIG. 1 and FIGS. 20A and 20B allows the electrical connection of the semiconductor optical device 19, which is mounted on the bench 17, via the pad electrodes disposed on the rear wall 15c. The optical module illustrated in FIG. 1 can be produced by a cutting process performed along the third cutting line C3T, the fourth cutting lines C4T and the fifth cutting line C5T which are positioned inside the first outer opening 83 and outside the inner opening 79. In contrast, the optical module shown in FIGS. 20A and 20B are made by a cutting process performed along the third cutting line C3T, the fourth cutting lines C4T and the fifth cutting line C5T, which are positioned outside the inner opening 79 and the first outer opening 83.

In the method of producing an optical module 11, the inner opening 79, which is disposed for a cavity having a bottom face 79a provided in the third region 71e of the silicon wafer 71, and the first outer opening 83, which is disposed for the rear wall having the side 83b provided in the fifth region 71g of the silicon wafer prepared as an example of a single crystal semiconductor substrate, are formed by etching the first surface 71a, and the second outer opening 93, which is provided for the front wall 15b having a bottom surface 93a in the first region 71c of the silicon wafer 71, is formed by etching the second surface 71b. The first mask 77 having the first opening pattern 77a and the second mask 91 having the third opening pattern 91a are formed by patterning such that the side face 93b of the second outer opening 93 and the front side face 79b of the inner opening 79 both are located in the second region 71d of the silicon wafer 71. The first opening pattern 77a of the first mask 77 is located in the third region 71e, and the second opening pattern 77b of the first mask 77 is positioned in the fifth region 71g. The second outer opening 93 and the first outer opening 83 for the front wall 15 b and the rear wall 15c of the cap 15, and the inner opening 79 for the cavity 25 can be formed by etching. The side face 79b of the inner opening 79, the side face 83b of the first outer opening 83 and the side face 93b of the second outer opening 93 extend along the first inner reference plane RE11F, the first outer reference plane RE12F, and the second outer reference plane RE13F, respectively, and the first inner reference plane RE11F and the second outer reference plane RE13F each form an acute angle ACUT with the first reference plane RE1F. The wiring metal layer 85 for the pad electrodes 24 and conductors 26 is formed on the fourth region 71f and the fifth region 71g of the single crystal semiconductor substrate, so that the resultant optical module 11 includes the pad electrodes 24 and the conductors 26 disposed on the rear outer face 15h of the rear wall 15c. This manufacturing method can provide the optical module 11 that can be electrically connected to an external device via the wiring metal layer (the wiring metal layer 85 for the conductors 26 and the pad electrodes 24 on the cap 15) rather than electrodes on the bench product SPBN (electrodes on the bench part). The optical module 11 can reduce restrictions on mounting the optical module 11 in terms of the direction of the optical coupling of the optical module.

Further, in the present manufacturing method, the second outer opening 93 for separation having a bottom face 93a located in the first region 71c is formed on the second surface 71b of the silicon wafer 71, and the inner opening 79 for a cavity having the bottom face 79a located in the third region 71e is formed in the first surface 71a of the silicon wafer 71. The side face 79b of the inner opening 79 and the side face 93b of the second outer opening 93 are located in the second region 71d of the silicon wafer 71. The side face 79b of the inner opening 79 and the side face 93b of the second outer opening 93 extends along the first inner reference plane RE11F and the first outer reference plane RE12F, respectively, and the first inner reference plane RE11F and the first outer reference plane RE12F each form an acute angle ACUT with the first reference plane RE1F. A light beam passing through the side face 79b and the side face 93b is refracted at each of the side face 79b and the side face 93b, so that the height of intersection of the optical axis with the side face 93b of the second outer opening 93 can be made higher than the height of intersection of the optical axis with the side face 79b of the inner opening 79 with respect to the bottom face 93a of the second outer opening 93 in the direction from the first surface 71a of the silicon wafer 71 to the second surface 71b. This difference in height make it possible to separate the intersecting point of the optical axis and the outer face of the front wall 15b of the cap 15 from the end of the second side face 93b of the outer opening 93 in the direction normal to the second bottom face 93a of the outer opening 93, and the optical non-uniform shape in the separation end (tip TIP) is likely to be formed in cutting the bottom face 93a of the second outer opening 93 in the formation of the cap 15, but the non-uniform shape thus formed is made apart from the intersecting point of the optical axis and the side face 93b of the second outer opening 93. As seen from the present embodiment described above, a method of producing an optical module provides which is to be optically coupled to the side face rather than the back surface of the substrate is provided.

EXAMPLE

The method according to the present embodiment described above, an LD module is produced which includes a laser diode acting as the semiconductor optical device 19. The LD module has vertical, transverse and height dimensions of, for example, about several hundred micrometers. In the LD module, as shown in FIG. 2, the laser beam emitted from the laser diode is collimated by a lens. The collimated light beam is not made perpendicularly incident on the Si (111) plane of the front wall of the cap, in particular, which is inclined at a non-right angle with respect to a (111) plane (e.g. 54.7 degrees). The incidence angle is determined by the directional relationship of a (111) plane and the plane orientation of the silicon-based principal surface. Since the refractive index of the silicon semiconductor (about 3.4) is larger than the refractive index of air (about 1), the laser light beam is incident on the silicon semiconductor of the front wall to be refracted, so that the incident direction of the laser light beam is changed with respect to an incident position in the direction from the bench of the LD module to the cap to the propagating direction in the silicon semiconductor of the cap front wall. Further, the propagating laser light beam is refracted at the emission from the silicon semiconductor of the cap front wall, and is emitted from the cap front wall at a higher position than the incident position to propagate parallel to the incident direction of the laser light beam. The LD module having a structure enabling the light beam to pass through the front wall can be produced, thereby reducing the influence of the tip of the front wall (influence of the light scattering), which is formed by dicing in the production process. In the fabrication of the LD light module, the LD light module is separated by dicing the cap product SPCP, and in the LD light module thus fabricated as described above, the optical propagation path on which the laser light beam passes across the front wall of the silicon cap is changed away from the tip of the front wall which is produced by dicing.

The LD module is supported by an external device at the front wall of the cap having an inner face and an outer face each of which has a (111) plane, and the laser diode is fed through the pad electrodes on the cap and the electrodes on the bench. The module in which a laser diode is connected to electrodes on the cap via electrodes on the bench allows the laser diode to optically couples to an external device through the front wall of the cap having the inner and outer faces of a (111) plane.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. An optical module including:
a bench part including a bench, an electrode, a semiconductor optical device, and a lens, the bench having a principal surface with a first area and a second area, the electrode being disposed on the first area and the second area, the semiconductor optical device being disposed on the electrode in the first area, and the lens being supported by the first area; and
a cap disposed on the bench part,
the cap including a base, a pad electrode and a conductor, the cap having a cavity, a ceiling, a front wall, a first side wall, a second side wall, and a rear wall, the cavity containing the semiconductor optical device and the lens, the pad electrode being disposed on the base, and the conductor being disposed on the base and connected to the pad electrode,
the second area of the bench surrounding the first area, on the second area, the electrode being electrically connected to the conductor,
the semiconductor optical device, the lens and the front wall and the rear wall of the cap being arranged on the principal surface of the bench along an optical reference plane extending in a direction of a first axis, and
the ceiling extending along a first plane, the front wall having a front outer face extending along a second plane, the second plane intersecting with the first plane, and the rear wall extending from the ceiling in a direction from the cap to the bench.

2. The optical module according to claim 1, wherein
the first side wall and the second side wall of the cap extend in the direction of the first axis,
the front wall, the first side wall, the second side wall, and the rear wall are disposed on the second area of the bench, and
the semiconductor optical device and the lens are hermetically sealed by the cap and the bench part.

3. The optical module according to claim 1, wherein
the bench includes a silicon base, and
the silicon base of the bench has a recess for positioning the lens.

4. The optical module according to claim 1, wherein the bench part includes an insulating layer disposed on the electrode in the second area, the electrode includes a first portion, a second portion and a third portion, the first portion of the electrode extends on the first area to be connected to the second portion of the electrode, the insulating layer extends across the second portion of the electrode, and the third portion of the electrode connects the second portion of the electrode to the conductor.

5. The optical module according to claim 1, wherein the cap includes an insulating layer, the conductor includes a first portion, a second portion and a third portion, the first portion of the conductor connects the pad electrode to the second portion of the conductor, the insulating layer extends across the second portion of the conductor, and the third portion of the conductor connects the second portion of the conductor to the electrode.

6. An optical apparatus including;
an optical module; and
an optical part,
the optical module including:
a bench part including a bench, an electrode, a semiconductor optical device, and a lens, the bench having a principal surface with a first area and a second area, the electrode being disposed on the first area and the second area, the semiconductor optical device being disposed on the electrode in the first area, and the lens being supported by the first area; and
a cap disposed on the bench part,
the cap including a base, a pad electrode and a conductor, the cap having a cavity, a ceiling, a front wall, a first side wall, a second side wall, and a rear wall, the cavity containing the semiconductor optical device and the lens, the pad electrode being disposed on the base, and the conductor being disposed on the base and connected to the pad electrode,
the second area of the bench surrounding the first area,
on the second area, the electrode being electrically connected to the conductor,
the semiconductor optical device, the lens and the front wall and the rear wall of the cap being arranged on the principal surface of the bench along an optical reference plane extending in a direction of a first axis, and
the ceiling extending along a first plane, the front wall having a front outer face extending along a second plane intersecting the first plane, the rear wall extending from the ceiling in a direction from the cap to the bench,
the optical part supporting the front wall, and
the optical part being optically coupled to the semiconductor optical device through the front wall, and the front wall being made of a material allowing light of the semiconductor optical device to pass therethrough.

7. The optical apparatus according to claim 6, wherein the optical part includes a semiconductor integrated device having an optical grating coupler, the optical grating coupler being optically coupled to the semiconductor optical device.

* * * * *